US011137487B1

(12) United States Patent
Amarloo et al.

(10) Patent No.: US 11,137,487 B1
(45) Date of Patent: Oct. 5, 2021

(54) RADAR SYSTEMS USING PHOTONIC CRYSTAL RECEIVERS TO DETECT TARGET OBJECTS

(71) Applicant: Quantum Valley Ideas Laboratories, Waterloo (CA)

(72) Inventors: Hadi Amarloo, Waterloo (CA); Jaime Ramirez-Serrano, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 17/201,830

(22) Filed: Mar. 15, 2021

Related U.S. Application Data

(60) Provisional application No. 62/990,244, filed on Mar. 16, 2020.

(51) Int. Cl.
*G01S 13/00* (2006.01)
*G01S 7/285* (2006.01)
*G01S 7/481* (2006.01)

(52) U.S. Cl.
CPC ............ *G01S 13/003* (2013.01); *G01S 7/285* (2013.01); *G01S 7/4816* (2013.01)

(58) Field of Classification Search
CPC ...... G01S 7/285; G01S 7/4816; G01S 13/003; G02F 2202/32; B82Y 20/00; H01Q 15/0086
See application file for complete search history.

(56) References Cited

U.S. PATENT DOCUMENTS 5,689,275 A * 11/1997 Moore ................. H01Q 3/2676
343/772
7,409,116 B1    8/2008 Mackie et al.
(Continued)

FOREIGN PATENT DOCUMENTS

CN      102096068       6/2011
CN      209542832       10/2019
WO      2018221310      12/2018

OTHER PUBLICATIONS

Amarloo, et al., "Terahertz Line Defect Waveguide Based on Silicon-on-Glass Technology", IEEE Transactions on Terahertz Science and Technology, vol. 7, No. 4, Jul. 2017, 7 pgs.
(Continued)

*Primary Examiner* — Peter M Bythrow
(74) *Attorney, Agent, or Firm* — Henry Patent Law Firm PLLC

(57) ABSTRACT

In a general aspect, a radar system includes a photonic crystal receiver. In some aspects, the radar system includes a transmitter station configured to emit probe signals of RF electromagnetic radiation into a region. The radar system also includes a receiver station configured to process return signals of RF electromagnetic radiation from the region. The return signals are based on probe signals scattered from one or more objects in the region. The receiver station includes a photonic crystal receiver formed of dielectric material. The photonic crystal receiver includes an antenna structure, a photonic crystal structure, and a vapor. The receiver station also includes an optical system and a data processing subsystem. The optical system is configured to generate spectroscopic data based on optical signals from the photonic crystal receiver. The data processing subsystem is configured to generate a time series of property data based on the spectroscopic data.

27 Claims, 22 Drawing Sheets

(56) References Cited

U.S. PATENT DOCUMENTS

| | | | |
|---|---|---|---|
| 7,492,329 B2 * | 2/2009 | Wang | H01Q 13/28 |
| | | | 343/700 MS |
| 8,643,532 B1 * | 2/2014 | Puscasu | G01J 3/108 |
| | | | 342/4 |
| 8,906,470 B2 | 12/2014 | Overstolz et al. | |
| 10,605,840 B1 | 3/2020 | Amarloo et al. | |
| 10,823,775 B2 | 11/2020 | Anderson et al. | |
| 10,859,981 B1 | 12/2020 | Ramirez-Serrano et al. | |
| 10,971,818 B2 * | 4/2021 | Urzhumov | H01Q 19/191 |
| 10,979,147 B2 * | 4/2021 | Gordon | H04B 10/00 |
| 2001/0050641 A1 | 12/2001 | Itoh et al. | |
| 2005/0007118 A1 | 1/2005 | Kitching et al. | |
| 2006/0076518 A1 * | 4/2006 | Barker | B82Y 20/00 |
| | | | 250/504 R |
| 2006/0147213 A1 | 7/2006 | Rosenwald et al. | |
| 2006/0239688 A1 * | 10/2006 | Hillis | B82Y 20/00 |
| | | | 398/116 |
| 2007/0210956 A1 * | 9/2007 | Hillis | H01Q 3/2676 |
| | | | 342/179 |
| 2011/0001063 A1 | 1/2011 | Barker et al. | |
| 2013/0270434 A1 * | 10/2013 | Nelson | H01J 49/46 |
| | | | 250/305 |
| 2014/0160474 A1 | 6/2014 | Keller et al. | |
| 2014/0248020 A1 | 9/2014 | Fujita et al. | |
| 2015/0185256 A1 | 7/2015 | Funinoki | |
| 2015/0192532 A1 * | 7/2015 | Clevenson | G01R 33/323 |
| | | | 324/304 |
| 2016/0178843 A1 | 6/2016 | Fujita et al. | |
| 2016/0218726 A1 | 7/2016 | Overstolz et al. | |
| 2016/0363617 A1 * | 12/2016 | Anderson | G01R 29/0885 |
| 2017/0336695 A1 * | 11/2017 | Puscasu | G01J 5/024 |
| 2018/0284780 A1 * | 10/2018 | McWhirter | G05D 1/027 |
| 2019/0058232 A1 * | 2/2019 | Fruehling | H01P 5/107 |
| 2019/0187198 A1 * | 6/2019 | Anderson | G01R 29/0878 |
| 2019/0386364 A1 * | 12/2019 | Liang | H01Q 15/0086 |
| 2020/0006860 A1 * | 1/2020 | Othmezouri | H01Q 15/0086 |

OTHER PUBLICATIONS

Anderson, et al., "An atomic receiver for AM and FM radio communication", arXiv:1808.08589v1, Aug. 26, 2018, 6 pgs.

Cox, et al., "Quantum-Limited Atomic Receiver in the Electrically Small Regime", arXiv:1805.09808v2, Jun. 19, 2018, 6 pgs.

Edde, "Radar: Principles, Technology, Applications", Prentice Hall, PTR, Upper Saddle River, NJ, 1995, 77 pgs.

Fan, et al., "Atom based RF electric field sensing", Journal of Physics B: Atomic, Molecular and Optical Physics, Sep. 9, 2015, 17 pgs.

Fan, et al., "Effect of Vapor-Cell Geometry on Rydberg-Atom-Based Measurements of Radio-Frequency Electric Fields", Physical Review Applied 4, 044015, 2015, 7 pgs.

Glaser, "Fifty years of bistatic and multistatic radar", IEEE Proceedings, vol. 133, Pt. F, No. 7, Dec. 1986, 8 pgs.

Gosele, et al., "Wafer bonding for microsystems technologies", Sensors and Actuators 74, 161-168, 1999, 8 pgs.

Griffiths, "Multistatic, MIMO and Networked Radar: the Future of Radar Sensors?", Proceedings of the 7th European Radar Conference, Sep. 30-Oct. 1, 2010, 4 pgs.

Holloway, et al., "Detecting and Receiving Phase Modulated Signals with a Rydberg Atom-Based Mixer", arXiv:1903.10644v1, Mar. 26, 2019, 5 pgs.

Howard, et al., "A Geometric View of Multistatic Radar Detection", IEEE Asilomar, 2018, 5 pgs.

Inggs, et al., "Multistatic Radar: System Requirements and Experimental Validation", International Radar Conference, 10.1109/RADAR. 2014.7060435, 2014, 6 pgs.

Masteika, et al., "A Review of Hydrophilic Silicon Wafer Bonding", ECS Journal of Solid State Science and Technology, 3 (4) Q42-Q54, 2014, 13 pgs.

Meyer, et al., "Digital Communication with Rydberg Atoms & Amplitude-Modulated Microwave Fields", arXiv:1803.03545v2, Oct. 29, 2018, 10 pgs.

Norland, "Digital Signal Processing in Binary Phase Coded CW Multistatic Radar", IEEE Radar, 2003, 4 pgs.

Scullion, et al., "Slotted Photonic Crystal Sensors", Sensors 2013, 13, 3675-3710, Mar. 15, 2013, 36 pgs.

Sedlacek, et al., "Atom-Based Vector Microwave Electrometry Using Ribidium Rydberg Atoms in a Vapor Cell", Physical Review Letters, Aug. 6, 2013, 5 pgs.

Sedlacek, et al., "Microwave electrometry with Rydberg atoms in a vapour cell using bright atomic resonances", Nature Physics 8, Nov. 2012, 6 pgs.

Sedlacek, et al., "Quantum Assisted Electrometry using Bright Atomic Resonances", arXiv:1205.4461v1 [physics.atom-ph], May 20, 2012, 15 pgs.

Suni, et al., "Effects of Plasma Activation on Hydrophilic Bonding of Si and SiO2", Journal of the Electrochemical Society, 149 (6) G348-G351, 2002, 4 pgs.

Weiss, "Synchronisation of Bistatic Radar Systems", IEEE, 2004, 4 pgs.

WIPO, International Search Report and Written Opinion dated Jul. 5, 2021, in PCT/CA2021/050328, 10 pgs.

USPTO, Non-Final Office Action dated Jun. 15, 2021, in U.S. Appl. No. 17/142,017, 29 pgs.

USPTO, Notice of Allowance dated Jul. 21, 2021, in U.S. Appl. No. 17/142,012, 32 pgs.

WIPO, International Search Report and Written Opinion dated Jun. 17, 2021, in PCT/CA2021/050329, 7 pgs.

WIPO, International Search Report and Written Opinion dated Jun. 3, 2021, in PCT/CA2021/050341, 9 pgs.

Dharanipathy, "On the Investigation of Light-Matter Interactions in Slab Photonic Crystal Cavities", Thesis EPFL, Feb. 21, 2014, 186 pgs.

Dhillon, et al., "The 2017 terahertz science and technology roadmap", Journal of Physics D: Applied Physics, 2017, 49 pgs.

Knapkiewicz, "Technological Assessment of MEMS Alkali Vapor Cells for Atomic References", micromachines, 10,25, Dec. 31, 2018, 20 pgs.

Withayachumnankul, et al., "Integrated Silicon Photonic Crystals Toward Terahertz Communications", Advanced Optical Materials Jun. 16, 2018, 7 pgs.

* cited by examiner

US 11,137,487 B1

RADAR SYSTEMS USING PHOTONIC CRYSTAL RECEIVERS TO DETECT TARGET OBJECTS

CROSS-REFERENCE TO RELATED APPLICATIONS

This application claims priority to U.S. Provisional Application No. 62/990,244, which was filed on Mar. 16, 2020, and entitled, "Photonic Crystal Receivers." The disclosure of this priority application is hereby incorporated by reference in its entirety.

BACKGROUND

The following description relates to radar systems that use photonic crystal receivers to detect target objects.

Receivers are typically used to convert electromagnetic radiation to a useable form. For example, a receiver may be used in a radar system to detect electromagnetic radiation that has been scattered off one or more objects. In some systems, a transmitter of the radar system emits a strong radio frequency (RF) signal which then propagates towards a target; the target then scatters the strong RF signal, producing a scattered RF signal that is subsequently detected by the receiver.

DETAILED DESCRIPTION

Figure 1:
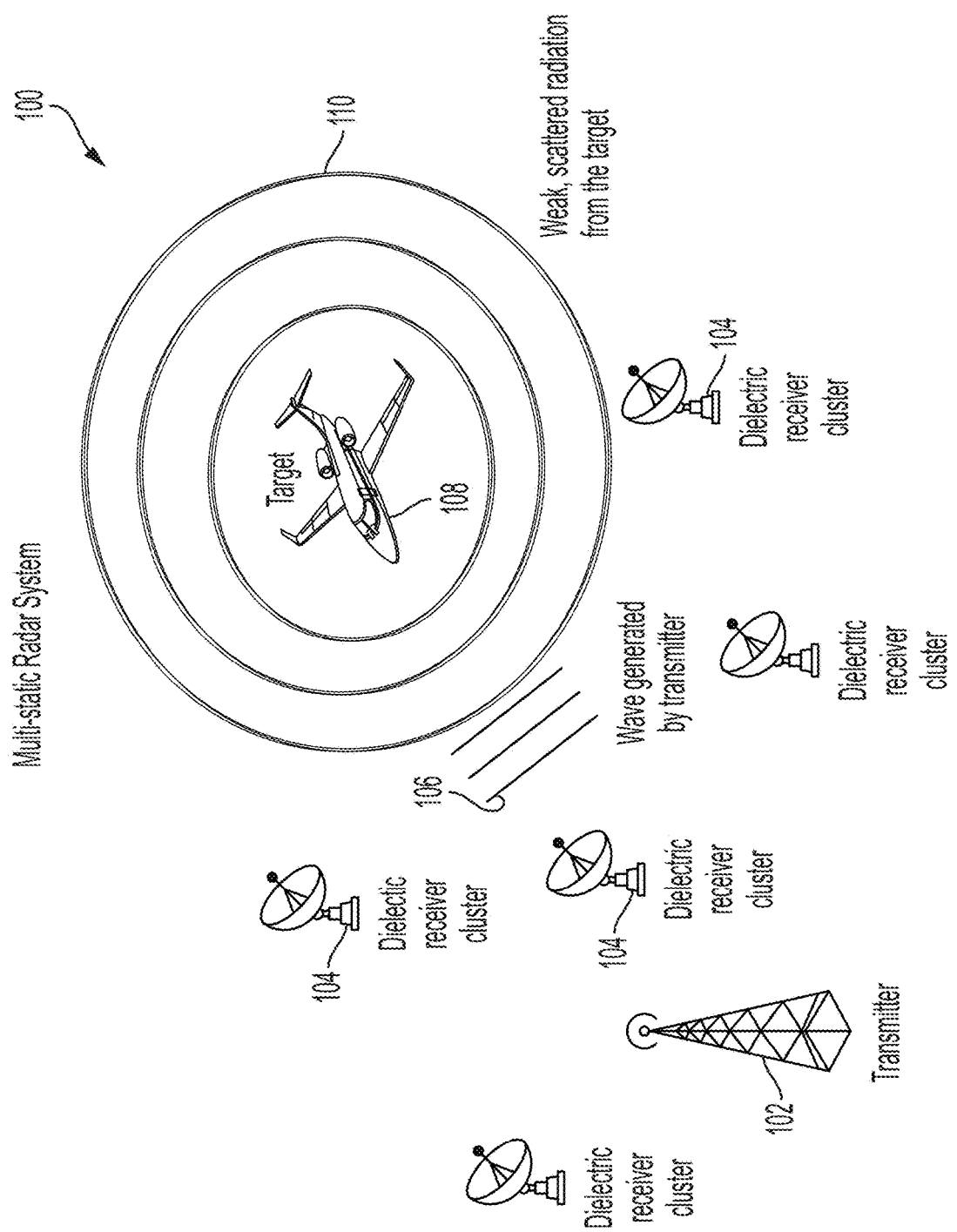
FIG. 1 is a schematic diagram of an example multi-static radar system that includes a transmitter station and multiple receiver stations.

Many typical radar systems today use metal receivers to detect signals scattered from a target object. The use of metal receivers, however, creates limitations for modern radar systems. For example, metal receivers are difficult to make polarization sensitive at levels that are useful for determining a target's shape. Metal receivers are also difficult to place next to each other because their metallic nature induces cross interference. Moreover, the amplitude of a scattered signal is commonly not used for detection because the metal receivers are not absolutely calibrated. Manufacturing and environmental variations of the metal receivers make such calibration very challenging.

Such limitations can inhibit or prevent the deployment of multifunctional radar systems, e.g., those capable of sensing multiple frequencies and polarizations. Multiple frequency and polarization measurements taken concurrently can extract important information from radar signals that cannot be determined with single frequency and/or polarization systems, such as storm intensity by measuring the shape of precipitation. For example, the metallic nature of metal receivers as well as their size, weight, and power (SWaP) prevents the application of radar—particularly multifunctional bi- and multi-static radar systems—to problems associated with determining the shape and composition of a target object, the detectability of a target object, and mitigating clutter and interference. However, a tremendous benefit could be brought to the civilian and military applications of radar if these problems could be addressed.

In some aspects of what is disclosed herein, a radar system includes a receiver station having one or more photonic crystal receivers for receiving signals of radio frequency (RF) electromagnetic radiation. The radar system may be a multi-static radar system or other type of radar system. The photonic crystal receivers can be formed of dielectric material, and as such, may be grouped or clustered. When grouped or clustered, the photonic crystal receivers can minimally interfere with each other and allow the radar system to operate with multifunctional capability. For example, two or more photonic crystal receivers may be configured to filter different, respective polarizations (e.g., orthogonal polarizations). Such configuration allows multiple polarizations to be determined at the same time and at approximately the same point in space. In another example, two or more photonic crystal receivers may be configured to operate at different, respective frequencies. This configuration allows multiple frequencies to be measured at approximately the same spatial location. The multifunctional capability of the radar system may allow the radar system to determine one or both of the shape and composition of a target object.

In addition, the SWaP for photonic crystal receivers can be less bulky, and when the receiver station is coupled with GPS and other inertial navigation subsystems for position and timing, enable dynamic multi-static radar systems to be realized. Multi-static systems can make it easier to detect targets as they allow the elimination of clutter and interference. Moreover, photonic crystal receivers can operate with self-calibrated amplitudes, which in turn, allows the use of amplitude data to gain further information about a target object. In typical conventional radar systems absolute amplitude can be difficult, if not impossible, to use to gain target information. This difficulty results from variations in the antenna of a metal receiver (e.g., variations in manufacturing, environmental response, etc.). Amplitude information may be particularly useful for distinguishing clutter and interference from actual target objects. Photonic crystal receivers may also allow the radar system to be produced at lower cost. For example, a single transmitter can be used for the radar system while multiple receivers can be dynamically positioned to optimize target detection and characterization.

In various implementations, photonic crystal receivers may provide one or more of the following advantages: [1] a photonic crystal receiver may act as its own filter, [2] a photonic crystal receiver may reach the standard performance without amplifiers, [3] multiple instances of photonic crystal receivers can be grouped together with minimal interference, [4] photonic crystal receivers can be sensitive to polarization, and [5] photonic crystal receivers may be self-calibrated. Moreover, photonic crystal receivers may be used with diode lasers, which are small and compact in size. Moreover, photonic crystal receivers may be powered by low power electronics with no need for a power amplifier. The elimination of a power amplifier may allow for portable and compact multi-static radar systems.

Now referring to FIG. 1, a schematic diagram is presented of an example multi-static radar system 100 that includes a transmitter station 102 and multiple receiver stations 104. The transmitter station 102 emits probe signals of electromagnetic radiation 106, such as radio frequency (RF) electromagnetic radiation, that interact with a target 108, such as an airplane. The target 108 scatters the electromagnetic 106 which spreads outward into an ambient environment of the target 108. The scattered electromagnetic radiation 110 is commonly weaker in intensity than the emitted electromagnetic radiation 106. The receiver stations 104 are disposed in an environment of the transmitter station 102 and are configured to process return signals of electromagnetic radiation based on the scattered electromagnetic radiation 110 (or portions thereof). To improve reception of the scattered electromagnetic radiation 110, one or more of the receiver stations 104 may include a dish to increase a capability to intercept and focus the return signals of electromagnetic radiation.

The receiver stations 104 may include one or more photonic crystal receivers. In FIG. 1, each of the receiver stations 104 is presented as having a cluster of photonic crystal receivers. However, other receiver configurations are possible. In some instances, one or more of the receiver stations 104 include a single photonic crystal receiver. In some instances, one or more of the receiver stations 104 may include a group or a cluster of photonic crystal receivers. In some cases, the target 108 may be a cooperating target. In these cases, the target 108 has a transmitter that emits electromagnetic radiation that is detected by the receiver stations 104. The receiver stations 104 can determine the position of the target 108 (e.g., via timing of scattered pulses), the velocity of the target 108, (e.g., via Doppler shifts of scattered pulses), the composition of the target 108 (e.g., via polarization characteristics of the scattered pulses), or some combination thereof. Other characteristics are possible (e.g., a shape of the target).

Radar works by detecting electromagnetic radiation—typically RF electromagnetic radiation—that is scattered off objects, such as the target 108. Optimally, objects that are targets for detection can be discriminated from objects that are not interesting (e.g., clutter). In some examples, a transmitter—e.g., transmitter station 102—emits a strong probe signal that propagates into a region of interest containing one or more objects, such as target 108. The one or more objects scatter the probe signal, which is subsequently detected by a receiver—e.g., one or more of receiver stations 104—as a weaker return signal. The return signal may include an emitted signal if the target for detection is a cooperating target. The return signal is used to obtain information about the one or more objects, and in particular, a target object. The return signals are weaker compared to the probe signal because the probe signal spreads out as it propagates into the region of interest. Additionally, the target object scatters the probe signal in many directions, which subsequently further spreads out in space. Competing with the detection of the target object is clutter and/or unwanted signals that come from non-target objects including other antennas. The receiver must be able to detect a return signal that is weaker than the probe signal emitted by the transmitter.

A radar system may operate using electromagnetic radiation that has a frequency in the range from 300 MHz-300 GHz. The operating frequency chosen for a particular application may be determined by the size of an intended target and a propagation distance (e.g., in the atmosphere). For example, G-band frequencies (e.g., for moderate-ranged radar 4-6 GHz), E/F or D band frequencies (e.g., for longer-ranged radars 1-4 GHz), and I/J band frequencies (e.g., for weather radars 8-20 GHz) may be used. Continuous wave, quasi-continuous wave and pulsed radars are also possible. In some variations, a transmitter of the radar system may emit probe signals with a power up to megawatts and detect milliwatt or microwatt return signals in bandwidths of around 1 MHz. In some variations, a radar system may use focusing devices, so-called dishes, to enhance the sensitivity of a receiver, particularly at higher frequencies. For pulsed radar, the repetition rates may range from 100 Hz-100 kHz. The pulse widths may be milliseconds to tens of nanoseconds. In some cases, the radar system may use mm-wave frequencies.

Radar systems may be designed to extract as much information from the return signals as possible. Useful information may come from: [1] the timing of the return signal, which may be used for ranging, [2] Doppler shifts of the return signal, which may be used for measuring target velocity, and [3] polarization, which may be used for estimating size, shape and composition. Radar signals may be processed by signal processing electronics to generate such information. Such signal processing may use modulation and demodulation methods for extracting properties of the return signals (e.g., timings, Doppler shifts, polarization, etc.).

A multi-static radar system, such as the multi-static radar system 100 of FIG. 1, may refer to a radar system where a single or limited number of transmitter stations are used in conjunction with multiple receiver stations. When employing receiver stations that include one or more photonic crystal receivers, these systems may have one or more advantages, including: [1] increased coverage, which may also effectively increase the radar cross-section of a target object, [2] a reduction in detectability, [3] an increased survivability due to redundancy, and [4] a reduction or elimination of clutter and interference. Other advantages are possible. In some implementations, the multi-static radar systems include a transmitter station that is cooperative or non-cooperative. A cooperative transmitter station may be controlled by an operator or computer system to operate in a collaborative manner with the one or more receiver stations of the multi-static radar system. A non-cooperative transmitter station may be a passive, emitting ambient RF electromagnetic radiation into an environment of the multi-static radar system (e.g., a cell phone tower). In some implementations, the multi-static radar system includes one or more transmitter stations that are mobile. For example, the multi-static radar system may include a transmitter station mounted on a mobile vehicle, such as a drone, manned plane, a boat, or a truck.

In many implementations, the multi-static radar system includes one or more transmitter stations located at significant distances from the receiver stations. In these implementations, the multi-static radar system may form a net or netted system. A net or netted system is advantageous for military applications since the transmitter stations can be stood-off in relatively safe locations while the receiver stations can be positioned in more dangerous positions. If the system loses a subset of receivers (e.g., from hostile fire), the system is not completely disabled. This advantage extends to radar jamming since each receiver station must be jammed independently when the receiver stations are distributed. Moreover, because the receiver stations may be independent from the transmitter stations, an enemy would have a difficult time finding the receiver stations to jam since the probe signal from the transmitter station is used to direct the jamming signal. Multiple receiver stations are also advantageous for civilian applications. By having multiple receiver nodes, the multi-static radar system does not lose functionality with the loss of a single receiver node, and as such, helps in the maintenance and graceful aging of systems used for applications such as airport surveillance radars.

Having multiple mobile receiver stations can also allow the receiver stations to be positioned optimally in a net to discern the difference between clutter and actual signals. The net allows targets to be triangulated (or be more easily triangulated). Furthermore, the receiver stations can operate coherently using GPS and inertial guidance and timing systems. However, adding multifunctional capabilities to such a system can be difficult if the system relies on metal receivers. In particular, the antennas of the metal receivers may interact with each other. However, such interaction can be mitigated if the receiver stations use photonic crystal receivers formed of dielectric material. In this case, it is also possible to use lower power transmitters for the netted system since the target-to-receiver distance can potentially be reduced by spreading the receiver stations out in space.

A further advantage of having multiple receiver stations includes the fusion of data. For example, a receiver station may use two receivers (e.g., photonic crystal receivers) at different, respective frequencies. The first receiver may be used to receive a signal from a target object, which may include a first frequency (or first range of frequencies). The second receiver may be used to receive a synchronization signal from a transmitter station, which may include a second frequency (or second range of frequencies). The minimal interference and cross coupling offered by the more electromagnetically transparent, dielectric receiver can be advantageous in such a case. The fusion of data may include receiving data from multiple receiver stations, synthesizing or processing the received data, and distributing the synthesized data back to the transmitter stations and/or the receiver stations. The synthesized data may also be distributed to other stations or parties (e.g., a central base station).

Photonic crystal receivers can provide advantages for radar systems, for example, over metal receivers. Photonic crystal receivers use vapor- or Rydberg atom-based detection of electromagnetic radiation. Such receivers can operate at comparable sensitivities to state-of-the-art metal receivers, all while being formed of dielectric materials, being capable of self-calibration, and not needing power amplification. Photonic crystal receivers may have an increased electric field sensitivity over current state-of-the-art Rydberg atom-based receivers by greater than three orders of magnitude. Photonic crystal receivers may also include features such as: [1] the efficient coupling of an electromagnetic wave into a photonic crystal frame via one or more tapers, [2] a photonic crystal polarizer to enhance polarization sensitivity, [3] slowing down of the electromagnetic wave using a photonic crystal structure, [4] concentration of the electromagnetic wave using a slot waveguide, and [5] concentration of the electromagnetic wave using photonic mirrors to form a cavity. In many variations, photonic crystal receivers integrate all these features. Photonic crystal receivers may also be monolithic, in that they do not have to be enclosed in an external vapor cell, have no metallic parts, and have no blown glass features (which can be difficult to control dimensionally and cause error). The ability of photonic crystal receivers to be self-calibrated is very useful for synthesizing or fusing data in netted radar systems.

Figure 2:
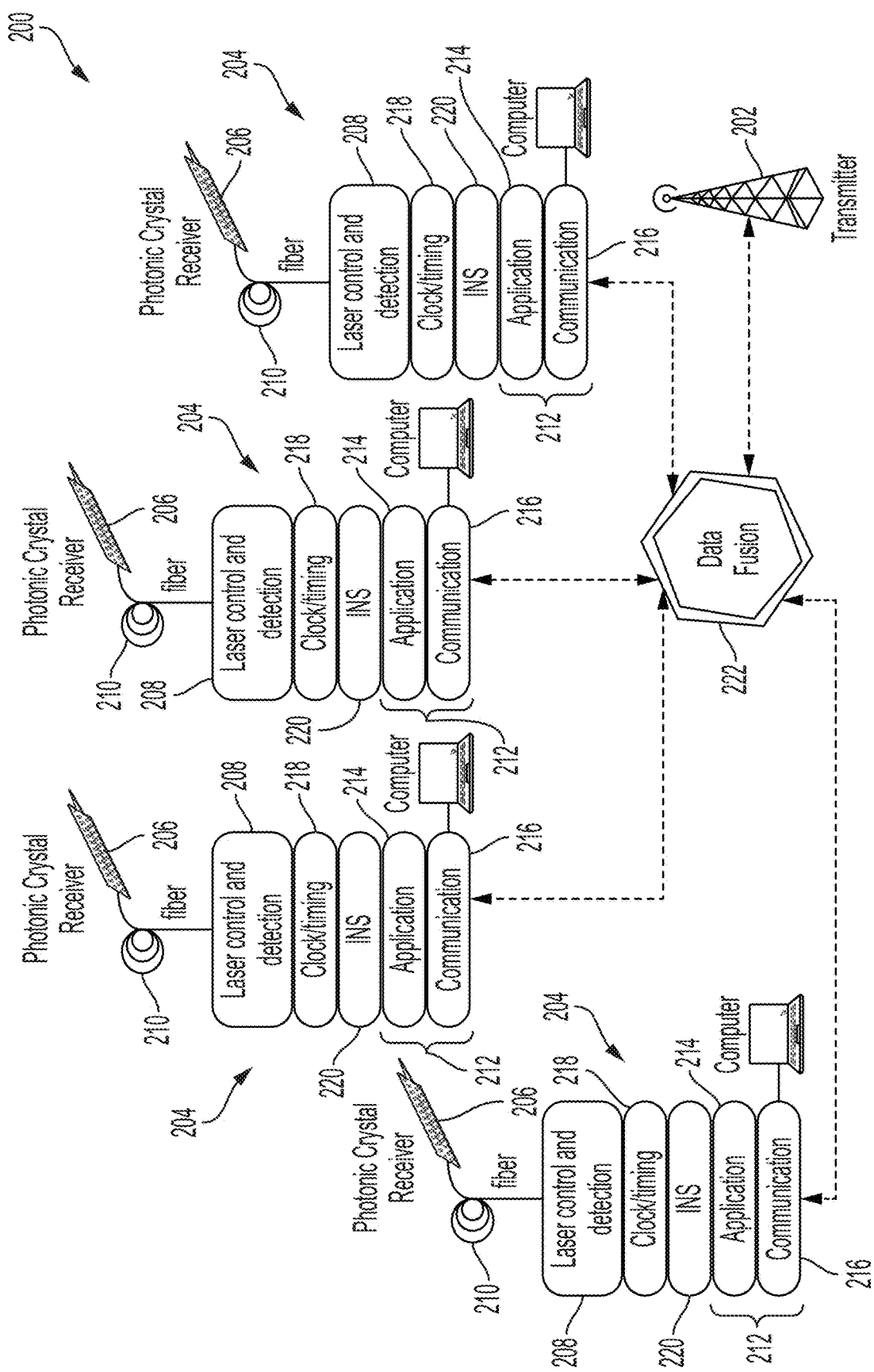
FIG. 2 is a schematic diagram of an example radar system that includes a transmitter station and a receiver station.

Now referring to FIG. 2, a schematic diagram is presented of an example radar system 200 that includes a transmitter station 202 and a receiver station 204. The example radar system 200 may include a plurality of receiver stations 204, such as shown in FIG. 2. The transmitter station 202 is configured to emit probe signals of RF electromagnetic radiation into a region. The probe signals may be defined by a continuous emission of RF electromagnetic radiation, a pulsed emission of RF electromagnetic radiation, or a combination thereof. In some variations, the transmitter station 202 is a cooperative transmitter station configured to emit probe signals of RF electromagnetic radiation into the region in response to control signals, such as generated by an operator or a computer system. In some variations, the transmitter station is a noncooperative transmitter station configured to passively emit probe signals of RF electromagnetic radiation into the region. Examples of the noncooperative transmitter station include a cell tower and a transmitter station purposed for another radar system. The transmitter station 202 may be stationary or mobile. For example, the transmitter station 202 may be mounted on a mobile vehicle, such as a drone, manned plane, a boat, or a truck. In some implementations, the example radar system 200 includes a plurality of transmitter stations 202.

The receiver station 204 is configured to process return signals of RF electromagnetic radiation from the region. The return signals are based on probe signals scattered from one or more objects in the region, such as a target object. The receiver station 204 includes a photonic crystal receiver 206, which may be formed of dielectric material. The photonic crystal receiver 206 includes an antenna structure configured to couple to a target RF electromagnetic radiation, which may have a frequency (or frequencies) within a range from 1 MHz to 1 THz. The target RF electromagnetic radiation may correspond to a single frequency, a range of frequencies, or both. In many variations, the target RF electromagnetic radiation is part of the return signals of RF electromagnetic radiation. For example, the target RF electromagnetic radiation may share a frequency in common with the return signals of RF electromagnetic radiation. The target RF electromagnetic radiation may also have a frequency range that overlaps with one or more frequencies associated with the return signals of RF electromagnetic radiation. The photonic crystal receiver 206 also includes a photonic crystal structure having an elongated slot disposed therein and configured to concentrate the target RF electromagnetic radiation in the elongated slot. A vapor is disposed in the elongated slot. In some variations, the photonic crystal receiver 206 is paired with a dish to increase a sensitivity of the photonic crystal receiver 206 to return signals of RF electromagnetic radiation. Further examples of the photonic crystal receiver 206 are described in relation to FIGS. 4A-17.

In some implementations, the receiver station 204 includes a plurality of photonic crystal receivers 206. In some variations, one or more of the plurality of photonic crystal receivers 206 are dedicated to distinct properties of the target RF electromagnetic radiation (e.g., different respective frequencies, different respective polarizations, etc.) For example, the plurality of photonic crystal receivers 206 may include a first photonic crystal receiver and a second photonic crystal receiver. A first antenna structure of the first photonic crystal receiver 206 may include a first polarizer configured to filter a first polarization of the target RF electromagnetic radiation, and a second antenna structure of the second photonic crystal receiver includes a second polarizer configured to filter a second, different polarization of the target RF electromagnetic radiation. The first and second polarizations may be orthogonal to each other. However, other relative orientations are possible. In another example, a first antenna structure of the first photonic crystal receiver is configured to couple to a first frequency of the target RF electromagnetic radiation (or a first range of frequencies), and a second antenna structure of the second photonic crystal receiver is configured to couple to a second, different frequency of the target RF electromagnetic radiation (or a second, different range of frequencies). In some variations, one or more subgroups of the plurality of photonic crystal receivers 206 are dedicated to distinct properties of the target RF electromagnetic radiation.

The receiver station 204 also includes an optical system 208 configured to generate spectroscopic data based on optical signals from the photonic crystal receiver 206. The spectroscopic data represents one or more properties of the target RF electromagnetic radiation. In some variations, such as shown in FIG. 2, the optical system 208 is coupled to the photonic crystal receiver 206 by a fiber optic cable 210. The optical system 208 may include a laser subsystem configured to provide, to the elongated slot, input optical signals that interact with one or more electronic transitions of the vapor. The optical system 208 may also include an optical detection subsystem configured to generate the spectroscopic data based on output optical signals from the elongated slot. The optical system 208 may additionally include control electronics for controlling one of both of the laser subsystem and the optical detection subsystem. The fiber optic cable 210 may be operable to transmit the input optical signals from the laser subsystem to the photonic crystal receiver 206, transmit the output optical signals from the elongated slot to the optical detection subsystem, or both. In some variations, the input and output optical signals are transmitted by respective fiber optic cables.

The receiver station 204 additionally includes a data processing subsystem 212 configured to generate a time series of property data based on the spectroscopic data. The time series of property data represents one or more properties of the target RF electromagnetic radiation over time. Examples of the one or more properties include an amplitude, a phase, a frequency, and a polarization. Other properties are possible. The data processing subsystem 212 may include one or more processors and one or more memories to assist in generating the time series of property data. The one or more processors and one or more memories may define an application layer 214 of the data processing subsystem 212. In some variations, the data processing subsystem 212 may include a system-on-a-chip (SoC). In these variations, the SoC may be a central processing unit (CPU) combined with a field programmable gate array (FPGA). However, other configurations of the SoC are possible.

In some implementations, the time series of property data includes amplitude data representing an amplitude of the target RF electromagnetic radiation over time. In some implementations, the time series of property data includes phase data representing a phase of the target RF electromagnetic radiation over time. In some implementations, the time series of property data includes frequency data representing a frequency of the target RF electromagnetic radiation over time. In some implementations, the antenna structure includes a polarizer configured to filter a polarization of the target RF electromagnetic radiation, and the time series of property data includes polarization data representing a polarization of the target RF electromagnetic radiation over time. Combinations of amplitude data, phase data, frequency data, and polarization data are also possible.

In some implementations, the data processing subsystem 212 is further configured to determine, based on the time series of property data, a characteristic of a target object in the region. Examples of the characteristic include a location of the target object in the region, a velocity of the target object, a shape of the target object, and a composition of the target object (or portions thereof). The characteristics may be determined singly or in any combination.

The data processing subsystem 212 may also include a communication interface to exchange data with other stations of the example radar system 200. The communication interface may define a communication layer 216 of the data processing subsystem 212 and may be configured to couple to optical fibers, electrical cable (e.g., Ethernet cable), or both. The communication interface may also include an antenna to send and receive wireless signals (e.g., WiFi signals defined by the IEEE 802.11 standard, satellite signals, etc.). In some variations, the communication interface may allow the data processing subsystem 212 to exchange data with a computer (e.g., a laptop) to present a user interface to an operator. The user interface may allow the operator to control or perform maintenance on the receiver station 204. In many variations, the communication interface includes a system-on-a-chip (SoC). In these variations, the SoC may be a central processing unit (CPU) combined with a field programmable gate array (FPGA). However, other configurations of the SoC are possible.

In some implementations, the receiver station 204 includes a local clock subsystem 218 configured to set one or both of a local reference time and a local reference phase for the receiver station 204. The local clock subsystem 218 may allow the data processing subsystem 212 to correlate the time series of property data to the local reference time and the local reference phase. In some variations, the local clock subsystem 218 includes a navigation clock for positioning the receiver station 201. For example, the local clock subsystem 218 may include a GPS receiver to allow the local reference time and phase to be based on a GPS signal (if satellite communications are available). In some variations, the local clock subsystem 218 includes a backup clock such as a Cs/Rb clock, a maser, a quartz oscillator, or a chip-scale atomic clock. The backup clock can be combined with the GPS receiver (if present) to resynchronize the local reference time and phase, thereby allowing the local clock subsystem 218 to be steered by the GPS signal.

In some implementations, the receiver station 204 includes an inertial navigation subsystem 220 configured to determine a position of the receiver station 204. In variations where the receiver station 204 is mobile, the inertial navigation subsystem 220 may also be configured to track a movement of the receiver station 204. The inertial navigation subsystem 220 may include a navigation clock, which may be shared with the local clock subsystem 218. The inertial navigation subsystem 220 may also include an accelerometer, a GPS receiver, a gyroscope, or some combination thereof. The inertial navigation subsystem 220 may also utilize GPS positioning to determine the position of the receiver station 204. However, if satellite communications are denied, the inertial navigation subsystem 220 may track the position of the receiver station 204 using motion sensors (e.g., the accelerometer, the gyroscope, etc.).

In some implementations, such as shown in FIG. 2, each of the plurality of receiver stations 204 includes a local clock subsystem 218. In these implementations, the example radar system 200 may include a global clock station configured to exchange synchronization signals with the transmitter station 202 and the local clock subsystem 218 of each receiver station. The synchronization signals represent a global reference time and a global reference phase for the example radar system 200.

In further implementations, the example radar system 200 includes a data control center 222 configured to communicate with the transmitter station 202 and the plurality of receiver stations 204. The data control center 222 may, in certain cases, include the global clock station. The data control center 222 is also configured to perform operations that include generating processed data based on multiple time series of property data from respective receiver stations 204. The processed data represents a characteristic of the target object in the region. The operations also include communicating the processed data to the transmitter station 202, one or more of the plurality of receiver stations 204, or both. The data control center 222 may include a communication interface to exchange data with other stations of the example radar system 200. In some variations, the communication interface allows the data control center 222 to exchange data with one or more stations elsewhere, such as a base station at a remote location. The one or more stations may be on land, in air (e.g., on an airplane), a body of water (e.g., a boat), or in space (e.g., a satellite). The communication interface may define a communication layer of the data control center 222 and may be configured to couple to optical fibers, electrical cable (e.g., Ethernet cable), or both. The communication interface may also include an antenna to send and receive wireless signals (e.g., WiFi signals defined by the IEEE 802.11 standard, satellite signals, etc.). In many variations, the communication interface includes a system-on-a-chip (SoC). In these variations, the SoC may be a central processing unit (CPU) combined with a field programmable gate array (FPGA). However, other configurations of the SoC are possible.

During operation, the data control center 222 may generate the processed data by fusing the multiple time series of property data together. For example, the data control center 222 may fuse a time series of amplitude data from two or more receiver stations 204 to generate the processed data. In another example, the data control center 222 may fuse a time series of frequency data and a time series of polarization data from two or more receiver stations 204 to generate the processed data. Other combinations of property data are possible. The data control center 222 may have a large computational resource to process the multiple time series of property data quickly so that it can be distributed to stations 202, 204 of the example radar system 200 or users in communication with the example radar system 200. Such distribution can occur over fiber optic cable, electrical cable, or wireless signals. That data control center 222 may also be in communication with one or more satellites to facilitate the distribution of data. However, multiple communication methods and channels may be used depending on where the example radar system 200 is deployed and the environment of the example radar system 200. Fiber optic cabling may be desirable for high-speed, secure communications. In some cases, where a receiver station can communicate with the data control center 222 but not a GPS positioning signal, the example radar system 200 can be used to obtain the position of the receiver station by using return signals generated from targets and clutter. For example, one or more of the receiver stations can move relative to the rest of the stations 202, 204 in the example radar system 200.

The global clock station is operable to ensure that accurate timing and phase information can be distributed throughout the example radar system 200. The global clock station may include a global clock that corresponds to a maser, an atomic clock, or a GPS clock (which, in turn, may be based on an atomic clock). In some variations, the global clock may include quartz oscillators or a chip-scale atomic clock steered by GPS. The synchronization signal can be distributed through a communications system defined by the communications layer of each station 202, 204 and the data control center 222. In some variations, the synchronization signal may be distributed through training sequences broadcast by the transmitter station 202. The global clock station may be co-located at the data control center 222 or located at another secure location.

In some implementations, the transmitter station 200 is based on a conventional radar transmitter or array. However, it is also possible to use devices such as amplified Rydberg atom masers as sources for the transmitter. These types of transmitters are directional and can be used to lock onto a target object using the netted receiver stations 204. In other words, the example radar system 200 can be used for tracking with a narrow beam transmitter. Although FIG. 2 depicts the example radar system 200 with only one transmitter station 202, multiple transmitter stations 202 are possible. For example, a conventional scanning wide area transmitter could be used to find targets and a narrow bandwidth transmitter could be used to lock onto targets, combining the advantages of each type of transmitter with the netted plurality of receiver stations 204. Also, multilateration may be improved if multiple transmitter stations are utilized.

In some implementations, one or more of the receiver stations 204 include a photonic crystal receiver 206 coupled to a tracking system. The tracking system may be a three-axis, motor-driven mechanical drive that includes a gimbled mount. In these implementations, the photonic crystal receiver 206 is aligned with a direction determined by the tracking system. In some implementations, the laser subsystem includes lasers to generate the input optical signals (e.g., the preparation and readout signals), laser stabilization devices (e.g., laser locking and tuning references), systems for switching the laser frequencies, and the low-level electronics to control the laser subsystem. For receiver stations 204 that include a plurality of photonic crystal receivers 206, the laser subsystem may include multiple lasers or switches to allow a reduced number of lasers to drive the plurality of photonic crystal receivers 206. The low-level electronics may also include laser intensity stabilization units and the necessary actuators. In some implementations, the optical detection subsystem includes photodetectors for sensing the output optical signals and low-level electronics to control the optical detection subsystem.

In some implementations, one or more of the receiver stations 204 include a reference subsystem, which may include a reference antenna or Rydberg atom maser. The reference antenna or Rydberg atom maser may be used to determine the relative phase and frequency of the return signals by superimposing both the reference signal and the return signal at the position of the vapor in the elongated slot (e.g., via heterodyne measurements). Likewise, a multiphoton method configured in a loop can be used to determine the phase and frequency shift of the return signal. A Rydberg atom maser can also be used as an amplifier for a reference signal or a return signal received by a receiver station. For example, the reference signal may be a clocked RF signal emitted from a reference antenna that interacts with the photonic crystal receiver 206. The reference signal may also be an RF signal from a Rydberg atom maser that interacts with the photonic crystal receiver. A Rydberg atom maser can be configured to act as an amplifier for the photonic crystal receiver 206. A Rydberg atom maser may also be formed dielectric material and may also be prepared or pumped by the same laser types as used for the photonic crystal receivers 206.

In some implementations, the example radar system 200 includes a communications layer defined, in part, by the communication interface of each station 202, 204 and the data control center 222. The communications layer receives data from the application layer 214 associated with one or more receiver stations 204 (or respective data processing substations 212). Such data may be transferred to a local interface and storage unit, the data control center 222, and/or other receiver stations 204 as required. The configuration of the SoC for each communication interface depends on the number of communications channels between the stations 202, 204 and the data control center 222. The configuration also depends on the nature of the communication channel (e.g., type, transfer speed, power requirements, etc.). The communications layer may rely on transceivers of the communication interfaces to send and receive information over the communication channels. The protocols for the communication channels are specific to the nature of the channels, the data rates required, and the timings required. In implementations where the example radar system 200 is distributed over small area, Rydberg atom masers or lasers may be used for point-to-point communications to the data control center 222. The communications layer may also handle the exchange synchronization signals and data representing the position of a receiver station (or its movement).

In some implementations, one or more of the receiver stations 204 include a computer or a specialized SoC with a display for presenting a user interface. The display may also present radar data, such as the time series of property data or one or more characteristics of the target object. The user interface may be used to tune or perform maintenance on the example radar system 200. For example, the user interface may be used to manually relock lasers of the laser subsystem or to monitor locked (or relocked) lasers. Data storage may also be associated with the user interface. The display may be connected to the one or more receiver stations 204 via a communication interface that is part of the communications layer.

Figure 3:
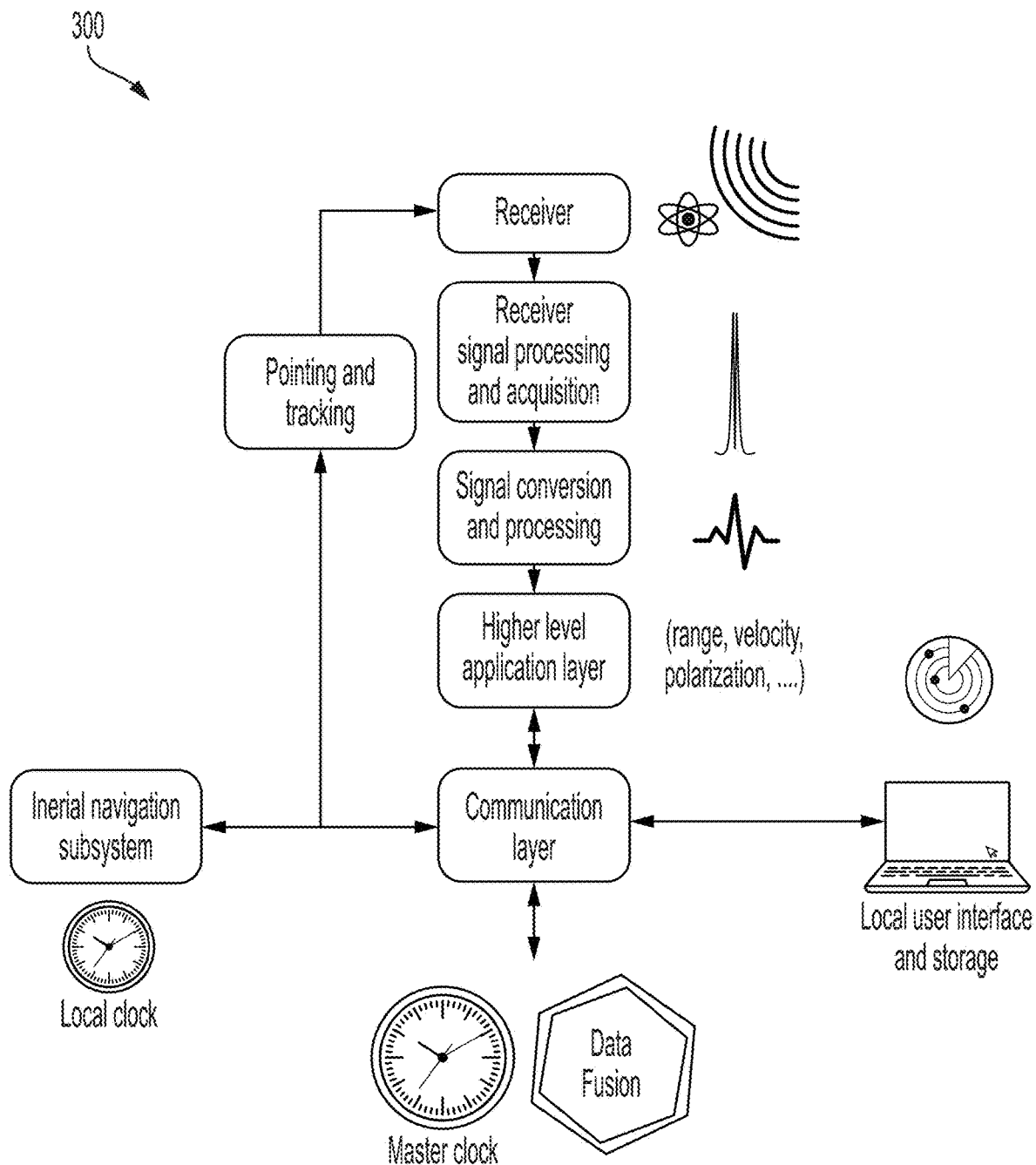
FIG. 3 is a schematic diagram of an example radar method for converting and processing radar signals.

Now referring to FIG. 3, a schematic diagram of an example radar method 300 for converting and processing radar signals. The example radar method 300 may start from a reception of the radar signals at a receiver station—or more specifically a photonic crystal receiver therein—and end with an operator of the receiver station. The example radar method 300 may be used to detect a target object in a region, and the operator may interact with the receiver station through a local user interface (e.g., a laptop or computer in communication with the receiver station). The schematic diagram shows the flow of a radar signal measurement and how different components of the receiver station work together to achieve the radar signal measurement. The radar signals may be defined by return signals of RF electromagnetic radiation produced in response to probe signals of RF electromagnetic radiation scattering from one or more objects in the region. A response of the vapor in the photonic crystal receiver to the return signal is converted to a time series of property data. The response of the vapor is read out from the photonic crystal receiver to generate a spectroscopic signal (e.g., an Autler-Townes splitting or a probe laser amplitude). These operations take place by cooperative action of the photonic crystal receiver, the laser subsystem, and the optical detection subsystem. The resulting spectroscopic data is converted to a time sequence that is synchronized with the local clock subsystem to provide accurate timing and phase information in the lower level of the application layer.

The application layer, which is controlled by the data processing subsystem, also converts the time series of property data into characteristics of the target object, such as range (or location), velocity, differential polarization, shape, and composition. Once converted, the communications layer passes the raw data (e.g., multiple time series of property data and multiple time series of characteristic data) to a local user interface and storage system, the data control center, and to a pointing and tracking system. The global clock station is used to synchronize the local clock subsystem of the receiver station, which provides a local reference time and phase to generate time sequenced data. The local clock subsystem may also include a navigation clock that is used by the inertial navigation subsystem to generate a position of the receiver station. The position of the receiver station may be communicated to the data control center. The local clock subsystem may support the inertial navigation subsystem if GPS signals are unavailable. Data fused (or processed) by the data control center can also be utilized by the pointing and tracking system.

In some implementations, the example radar method 300 includes transmitting, by operation of a transmitter station, probe signals of RF electromagnetic radiation into the region. The example radar method 300 also includes processing, by operation of a receiver station, return signals of RF electromagnetic radiation from the region. The return signals are based on probe signals scattered from one or more objects in the region. Processing the return signals includes receiving, at a photonic crystal receiver of the receiver station, the return signals of RF electromagnetic radiation from the region. The photonic crystal receiver is analogous to the photonic crystal receiver described in relation to FIG. 2. The example radar method 300 additionally includes generating, by operation of an optical system of the receiver station, spectroscopic data based on optical signals from the photonic crystal receiver. The spectroscopic data represents one or more properties of the target RF electromagnetic radiation. The example radar method 300 also includes generating, by operation of a data processing subsystem of the receiver station, a time series of property data based on the spectroscopic data. The time series of property data represents one or more properties of the target RF electromagnetic radiation over time.

In some implementations, a probe signal from the transmitter station is sent out to probe for targets in the coverage area of the netted radar system. The probe signals that can be emitted are quite general and may include sequences of pulses with different phase, amplitude, and polarization. Barker codes are one example of a type of radar pulse. The photonic crystal receiver detects a small, reflected signal from a target object (e.g., the return signal). This radiation is incident on the vapor in the photonic crystal receiver. The input optical signals are carried on laser light used for the Rydberg atom receiver. The output optical signals travel via fiber optic cabling to an optical system, which generates spectroscopic data. Properties such as an amplitude, a phase, a frequency, a polarization, or any combination thereof, can be extracted from the spectroscopic data. The properties as a function of time are constructed in the application layer using clock timing data from the local clock subsystem. The time sequenced data is then used to extract characteristics of the target object, such as a range (or location), a velocity, a shape, and a composition. Data representing the characteristics may be transferred to the data control center through the communication layer so that it can be integrated with data from other receiver stations. Such integration results in processed data that can better identify target objects and their properties. Such integration may also allow target objects to be better distinguished from clutter and interference. The local data and fused data returning to the receiver station can be used to help track a target object if desired.

The example radar method 300 includes determining, by operation of an inertial navigation subsystem of the receiver station, a position of the receiver station. The inertial navigation subsystem (INS) keeps a position of the receiver station if GPS signals are denied. However, GPS signals can be used to obtain the position of the receiver station if communication with a GPS satellite is available. The INS may only be required if the position of the receiver station moves while denied GPS positioning signals. The position of the receiver station may be relayed through the communication layer via a communication interface to the data control center. The example radar method 300 also includes setting, by operation of a local clock subsystem of the receiver station, a local reference time and a local reference phase for the receiver station. The local clock subsystem may also share a navigation clock with the INS. The navigation clock may be synchronized using synchronization signals from the global clock station. The synchronization signals may be transmitted through the communication layer via a communication interface. In some instances, the synchronization signal is based on a timing signal emitted by the transmitter station. Data representing a position of the transmitter station may also be communicated through the communications system or through the data control center. In some variations, the radar receiver can be pointed or used to track a target object using data communicated to the receiver station via the data fusion center or via the locally acquired radar data. The data may be used to drive a mechanical 3-axis pointing device such as a motorized gimbled mount.

Radar systems may include one or more receiver stations that incorporate a photonic crystal receiver. The photonic crystal receivers may operate using atoms in a vapor state, which may correspond to Rydberg atom-based sensing. In many variations, the photonic crystal receivers are configured to take radio frequency (RF) waves at MHz-THz frequencies and transduce the waves into an optical signal that can be converted to an electrical signal (e.g., using a photodetector). Production of the optical signal is assisted by the atoms in the vapor state, which serve as a transducing medium and interacts with the RF waves. In some implementations, the photonic crystal receivers enhance the electric field of the RF waves at the position of the vapor or Rydberg atoms. For example, the photonic crystal receivers may concentrate the RF waves in a waveguide and slow them down using a photonic crystal. Such enhancement can increase the sensitivity of the photonic crystal receivers to a magnitude better than or comparable to conventional radar receivers. In many implementations, the photonic crystal receivers include a monolithic photonic crystal frame that is operable to enhance the electric field of the RF waves (or RF electromagnetic radiation). In some implementations, the photonic crystal receivers are incorporated into a receiver system. The receiver system may include a laser and a fiber optic circuit to optically couple light from the laser to the photonic crystal receiver. The receiver system may also include detection and digital control systems capable of signal processing.

In some aspects of what is described herein, a photonic crystal receiver utilizes Rydberg atom-based sensing to provide high sensitivity to a target electromagnetic radiation at radio and mm-wave frequencies. Atoms in the vapor state are contained in the structure to sense the target electromagnetic radiation. The photonic crystal receiver may be constructed by creating a photonic crystal frame and then bonding one or two optical windows to the frame. Integrated into the frame is a silicon tapered antenna, which may also include a polarization filter. The photonic crystal frame may be formed of dielectric material, such as silicon. Other high dielectric materials with low loss (or low absorption), however, are possible, such as $BaLn_2Ti_4O_{12}$ (BLT) where Ln refers to one or more elements from the lanthanide group of the periodic table of elements. The optical windows may also be formed of dielectric material, such as glass or silicon. The dielectric materials of the frame and optical windows may be bonded through the assistance of adhesion layers (e.g., silicon or silicon dioxide) on the photonic crystal frame. The target electromagnetic radiation may then be read-out optically. Because the photonic crystal receiver can be manufactured accurately at scale and the sensors are atoms, the photonic crystal receiver can be self-calibrated.

The photonic crystal frame may include a line defect disposed in a periodic arrangement of holes that defines the photonic crystal. For example, the line defect may correspond to a row of "filled" holes—e.g., the absence of holes—in the periodic arrangement of holes. An elongated slot may be centered within the line defect to define a slot waveguide. A vapor may occupy the elongated slot, such as a vapor of Group IA atoms (e.g., a vapor of cesium atoms, a vapor of rubidium atoms, etc.). The vapor in the elongated slot is operable to sense RF electromagnetic radiation (e.g., RF waves) incident on the photonic crystal frame. The RF electromagnetic radiation may be enhanced or intensified in the elongated slot and has a group velocity that travels slower due to the presence of the photonic crystal structure. An antenna structure (e.g., a tapered protrusion) and polarization filter can be designed to efficiently couple the RF electromagnetic radiation into the line defect and elongated slot.

During manufacture, the vapor may be introduced into the photonic crystal receiver under controlled vacuum (or partial pressure) conditions. Low temperature contact bonding may be used to vacuum seal the vapor in the elongated slot. Other methods of filling the slot with atoms may also be used. For example, a paraffin-encased alkali sample or a laser-activated getter (SAES) may be located in a cavity connected to the elongated slot through a conduit. These sources of the vapor may be activated later by directing energy into the sources (e.g., heating by laser). One of the optical windows, or a fill hole in one of the optical windows, can be contact bonded so that the vapor remains pure in the elongated slot. Anodic bonding of both windows is a possible sealing method as well. However, other methods of bonding—e.g., anodic bonding—require the application of high temperatures, high voltages, or both, to the photonic crystal frame and optical window(s) to form a bond. Such application can lead to significant outgassing, which may compromise the performance of the photonic crystal receiver. In some cases, pure vapors of atoms are used for electric field sensing based on Rydberg atoms (e.g., pure vapors of cesium atoms). In some variations, a small stem may be used to fill the photonic crystal receiver. In these variations, both optical windows may be anodically bonded or frit bonded to the photonic crystal frame, before loading the vapor into the elongated slot through the stem.

The photonic crystal frame may include one or more tapers to minimize coupling losses between the different sections of the photonic crystal receiver through impedance matching. For example, during operation, the photonic crystal frame may capture the RF electromagnetic radiation with a tapered protrusion that extends from an end of the dielectric body. The tapered protrusion defines an antenna structure, and in some instances, includes a polarizer to filter a specific polarization. The periodic arrangement of holes in the photonic crystal frame may also be tapered (or offset) to slow a target RF electromagnetic wave down in a controlled manner. A second coupler can be used to couple the captured or received wave into the region (or elongated slot) within the photonic crystal frame. For example, the second coupler may be a taper internal to the tapered protrusion that is defined by one or more channels therein. In some variations, the photonic crystal frame includes a photonic crystal cavity to amplify the field strength of the RF electromagnetic radiation in the line defect (or elongated slot). A photonic crystal cavity can be implemented by tapering (or offsetting) the hole distance proximate one or both ends of the line defect to make those regions reflect the RF electromagnetic radiation back and forth along the axis of the photonic crystal receiver. In some variations, the photonic crystal frame may be configured to capture electromagnetic waves of a target frequency or range of frequencies, such as by selecting a size or spacing of the periodic arrangement of holes.

The photonic crystal receiver may be optically coupled to two or more read-out lasers (e.g., a coupling laser and a probe laser) during operation. Such optical coupling may occur through free space, by waveguides such as optical fiber, or some combination thereof. During operation, the effect of the target electromagnetic field on the vapor is encoded in light fields, which can be transported to a detector. Signals generated by the detector can subsequently be processed using either analog or digital electronics. Various modulation techniques may also be used with the light beams from the lasers to enhance the sensitivity of the photonic crystal receiver. Examples of such modulation techniques include frequency, amplitude, or phase modulation methods.

In some variations, the photonic crystal frame of the photonic crystal receiver includes a photonic crystal structure with a band gap for one or both of a transverse magnetic (TM) radiation and a transverse electric (TE) radiation. The photonic crystal structure may include a periodic arrangement of voids or cavities (e.g., a periodic arrangement of holes), and the TM and TE radiation may correspond to a specific target frequency or range of frequencies. The photonic crystal frame may also be configured to be sensitive to a polarization of the TM and TE radiation. The photonic crystal structure of the receiver, in some variations, serves to reduce a group velocity of the target electromagnetic radiation, thereby increasing the interaction time with the vapor located in the elongated slot, as well as the strength of the electric field.

Certain conventional manufacturing methods for constructing vapor cells that contain vapor or Rydberg atoms for sensing electromagnetic radiation rely on glass blowing, which can be imprecise and difficult to use when making small structures. For improved precision, photonic crystal receivers can be manufactured using precise machining processes (e.g., lasers and lithography) and low-temperature bonding processes. For example, the photonic crystal frame can be machined from silicon using a laser and then contact bonded to at least one optical window. Since the sealing bond between the photonic crystal frame and optical window(s) can form around 150° C. or lower, anti-spin relaxation coatings can be applied to the photonic crystal receivers (e.g., one or both optical windows) to increase the integration times. As such, photonic crystal receivers may also be used in other applications, such as for vapor cell magnetometry. The precise machining processes allow photonic crystal receivers to be self-calibrated. Self-calibration is useful for accomplishing tasks like eliminating clutter in multi-static radar systems. Moreover, different receivers' respective signal levels can be compared to each other in an absolute sense.

In many implementations, photonic crystal receivers are monolithically configured. For example, the example photonic crystal receivers shown in the drawings are not enclosed in an outer vapor cell and have no blown glass parts, either of which, can distort incident electromagnetic radiation, decreasing efficiency. Photonic crystal receivers may also include seamless integration of a light-slowing structure, a slot structure, and a photonic cavity structure into a single vapor cell forming a unique waveguide. This configuration is amenable to automated manufacturing and can readily scale to large production volumes.

In many variations, the components of photonic crystal receivers are made of all-dielectric materials so that multiple instances can be placed in the same vicinity. This close placement allows operation as closely-spaced groups of photonic crystal receivers. The dielectric materials allow groups of photonic crystal receivers to operate with minimal interference from neighboring receivers and notably reduced cross coupling. Interference and cross-coupling can be significant problems in radar and communications when multiple antennas are placed in the same area.

Figure 4A:
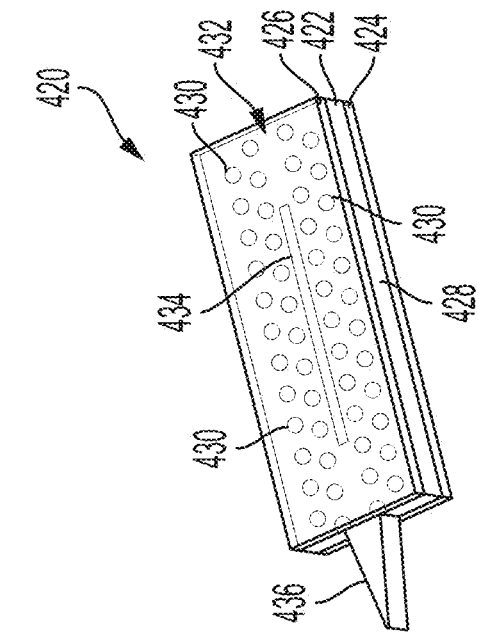
FIG. 4A is a schematic diagram of an example stemless vapor cell and an example photonic crystal receiver.
Figure 4A:
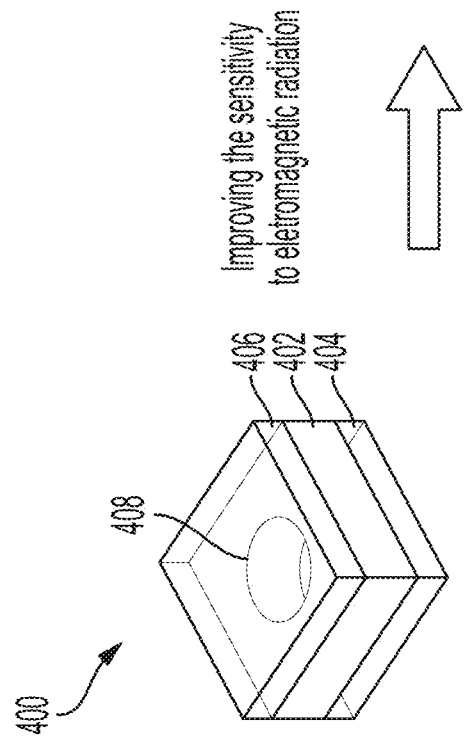

Now referring to FIG. 4A, a schematic diagram is presented of an example stemless vapor cell 400 and an example photonic crystal receiver 420. The example stemless vapor cell 400 includes a dielectric body 402 disposed between (and bonded to) two optical windows 404, 406. The dielectric body 402 of the example stemless vapor cell 400 includes a cylindrical cavity 408 that contains a vapor (e.g., a vapor of Cs atoms). The example photonic crystal receiver 420 also includes a dielectric body 422 disposed between (and bonded to) two optical windows 424, 426. However, unlike the example stemless vapor cell 400, the dielectric body 422 of the example photonic crystal receiver 420 defines a photonic crystal frame 428 (or structure). The photonic crystal frame 428 includes a periodic arrangement of holes 430 that defines a photonic crystal therein. The photonic crystal frame 428 also includes a defect 432 in the periodic arrangement of holes 430. The defect 432 may correspond to a row of "filled" holes—e.g., the absence of holes—in the periodic arrangement of holes 430.

An elongated slot 434 may be centered within the defect 432. The periodic arrangement of holes 430, the defect 432, and the elongated slot 434 may operate in tandem to define a waveguide in the photonic crystal frame 428. A vapor may occupy the linear cavity, such as a vapor of Group IA atoms (e.g., a vapor of cesium atoms, a vapor of rubidium atoms, etc.). In many variations, the photonic crystal frame 428 includes an antenna structure 436, such as a tapered protrusion, for coupling to electromagnetic radiation (e.g., RF radiation) incident on the example photonic crystal receiver 420. The features of the photonic crystal frame 428 improve a sensitivity of the example photonic crystal receiver 420 to electromagnetic radiation (e.g., electric fields), especially relative to the example stemless vapor cell 400. Such improvement may be at least three orders of magnitude (i.e., $10^3$) higher. The features of the photonic crystal frame 428 may also allow the example photonic crystal receiver 420 to be highly sensitive to a polarization of the electromagnetic radiation.

Figure 5:
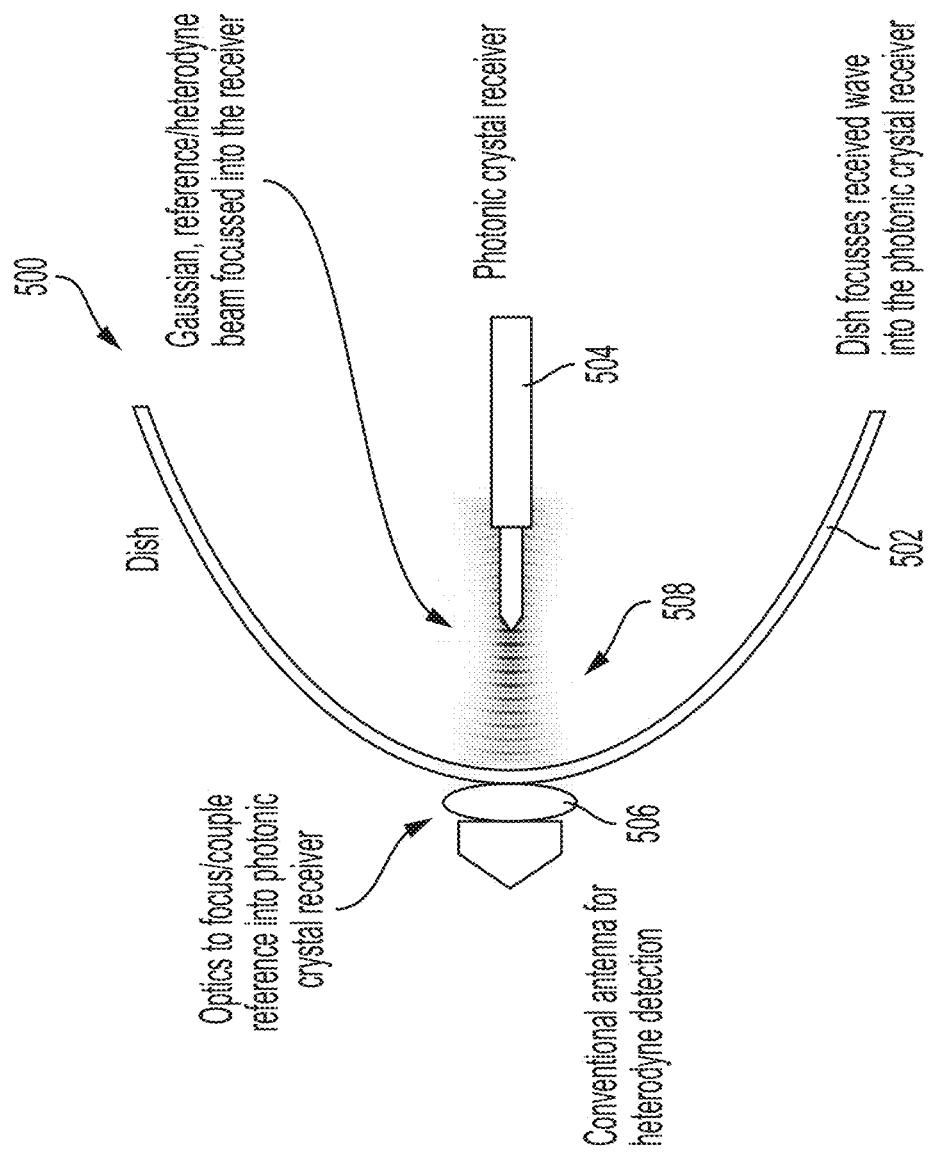
FIG. 5 is a schematic diagram of an example antenna that includes a dish and a photonic crystal receiver.

The example photonic crystal receiver 420 may be used with a dish to further improve its sensitivity to electromagnetic radiation. For example, FIG. 5 presents a schematic diagram of an example antenna 500 that includes a dish 502 and a photonic crystal receiver 504. The example antenna 500 may be configured for heterodyne detection. The dish 502 has a parabolic cross section defining a focal point, and the photonic crystal receiver 504 is disposed at (or adjacent to) the focal point to receive electromagnetic radiation focused by the dish 502. The example antenna 500 also includes optics 506 at an apex of the dish 502 to focus a Gaussian or reference/heterodyne beam 508 into the photonic crystal receiver 504. The reference beam may be an electromagnetic wave generated by an antenna or maser (e.g., a Rydberg atom maser) whose frequency is close to or at the target electromagnetic field carrier frequency. It can be used to do heterodyne detection, which may involve making the overall receiver somewhat metallic. The antenna can be made small and can be advantageous since it can be used at low emission powers to carry-out heterodyne detection of the target electromagnetic field.

The example photonic crystal receiver 420 may be configured to concentrate and slow down an incident field so that the sensitivity of the receiver to high frequency electromagnetic fields (MHz-THz) is increased by a factor greater than 1000 when compared to a bare vapor cell, such as the stemless vapor cell 400. A photonic crystal cavity can also be used to further increase the electromagnetic field intensity. The cavity can be implemented by changing the tapers at the ends of the photonic crystal waveguide to make reflective structures. The example photonic crystal receiver 420 may include a tapered coupler that can serve as a polarizer, if desired, and may also include a taper to reduce loss in coupling into the slot waveguide, and may further include a tapered array of holes for slowing the incident electromagnetic wave in a controlled manner so that losses are reduced. The example photonic crystal receiver 420 can use a dish (e.g., dish 502 of FIG. 5) to focus incoming electromagnetic radiation onto a coupler. These different features can be used independently or in any combination. In many configurations, the example photonic crystal receiver 420 is a compact, self-calibrated, all dielectric receiver that out-performs conventional receivers and competes with the best receivers in sensitivity. As used herein, the term "all dielectric" refers to a material construction that is more electromagnetically transparent than conventional receivers. Several instances of the example photonic crystal receiver 420 can be grouped together with minimal interference and cross-coupling due to their dielectric construction. The example photonic crystal receiver 420 can also exhibit enhanced polarization sensitivity over conventional antennas. The example photonic crystal receiver 420 is designed in a way that it can be reliably automated and mass produced for commercialization.

Figure 4B:
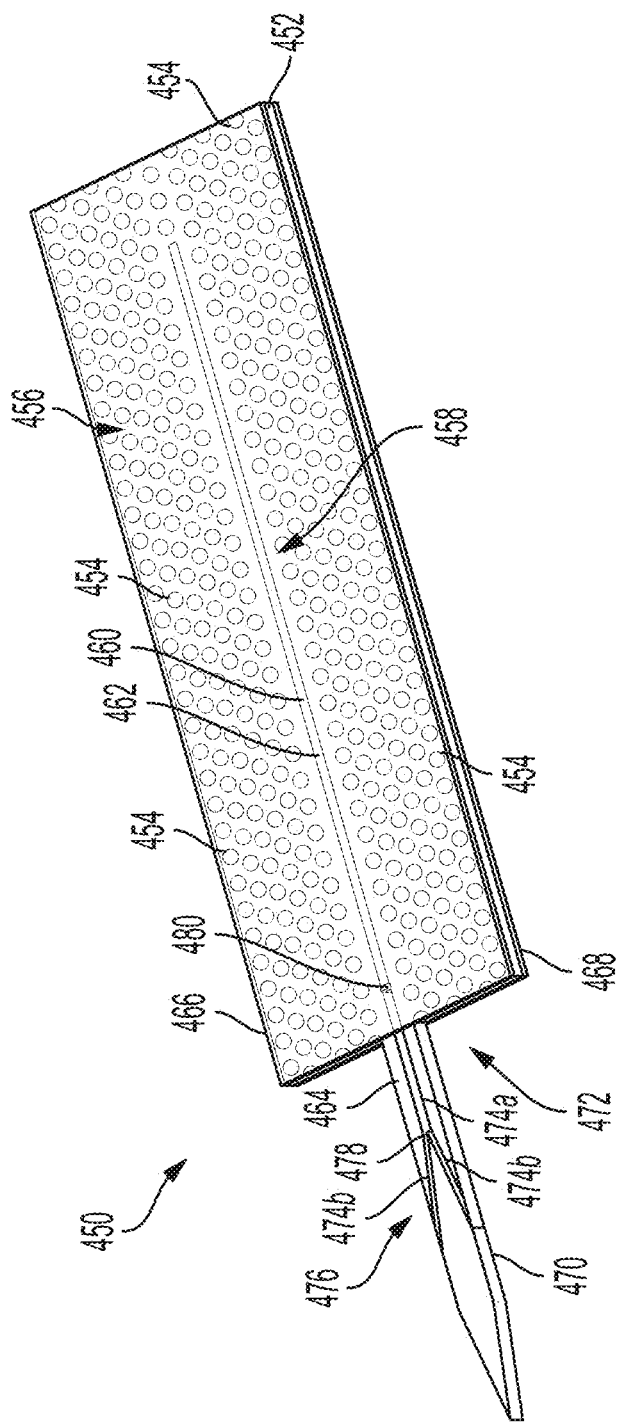
FIG. 4B is a schematic diagram, in perspective view, of an example receiver for sensing radio frequency (RF) electromagnetic radiation.

Now referring to FIG. 4B, a schematic diagram is presented, in perspective view, of an example receiver 450 (or example photonic crystal receiver 450) for sensing radio frequency (RF) electromagnetic radiation. The example receiver 450 may be analogous to the photonic crystal receiver 420 described in relation to FIG. 4A, and the RF electromagnetic radiation may have a frequency (or frequencies) within the range from 1 MHz to 1 THz. The example receiver 450 includes a dielectric body 452, which may be formed of a material substantially transparent to electric fields (or electromagnetic radiation) measured by the example receiver 450. The material may be an insulating material having a high resistivity, e.g., $\rho > 10^3$ Ω·cm, and may also correspond to a single crystal material, a polycrystalline material, or an amorphous (or glass) material. For example, the dielectric body 452 may be formed of silicon. In another example, the dielectric body 452 may be formed of a glass that includes silicon oxide (e.g., $SiO_2$, $SiO_x$, etc.), such as vitreous silica, a borosilicate glass, or an aluminosilicate glass. In some instances, the material of the dielectric body 452 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In certain variations, the combination may correspond to $BaLn_2Ti_4O_{12}$ where Ln refers to one or more elements from the lanthanide group of the periodic table of elements. In other instances, the material of the dielectric body 452 is a non-oxide material such as silicon (Si), diamond (C), gallium nitride (GaN), calcium fluoride (CaF), and so forth.

The dielectric body 452 includes an array of cavities 454 ordered periodically to define a photonic crystal structure 456 in the dielectric body 452. The array of cavities 454 may extend either partially or completely through the dielectric body 452. For example, the array of cavities 454 may be an array of blind holes, or as shown in FIG. 4B, an array of through-holes. The array of cavities 454 may also be partitioned into portions extending partially or completely through the dielectric body 452. For example, the array of cavities 454 may include a first portion extending partially through the dielectric body (e.g., blind holes) and a second portion extending completely through the dielectric body (e.g., through-holes). Although FIG. 4B depicts the array of cavities 454 as being an array of circular through-holes, other shapes are possible for the array of cavities 454 (e.g., hexagonal, oblong, etc.). The array of cavities 454 may have a maximum dimension (e.g., a diameter) in a range from 10 µm to 15 millimeters. The maximum dimension may be the same for each cavity. In some variations, each of the array of cavities 454 has a maximum dimension in a range from 0.5 millimeters to 10 millimeters. In some variations, the array of cavities 454 has a periodic spacing in a range from 0.9 millimeters to 15 millimeters. In some variations, the dielectric body 452 is a plate having a thickness in a range from 0.5 millimeters to 10 millimeters.

The dielectric body 452 also includes a region 458 in the array of cavities 454 defining a defect in the photonic crystal structure 456. In many variations, the region 458 is a solid region in the array of cavities 454 defined by an absence of cavities. The absence of cavities may correspond to the defect in the photonic crystal structure 456. For example, the defect may be a row or column of "filled" cavities. However, other patterns of "filled" cavities are possible. In some variations, such as shown in FIG. 4B, the region 458 may be disposed in a center of the dielectric body 452. The dielectric body 452 additionally includes an elongated slot 460 through the region 458 extending from a slot opening 462 in a surface 464 of the dielectric body 452 at least partially through the dielectric body 452. In some variations, such as shown in FIG. 4B, the elongated slot 460 is disposed in a center of the region and aligned along a longitudinal axis of the dielectric body 452. It will be appreciated that, during operation of the example receiver 450, the photonic crystal structure 456, the region 458, and the elongated slot 460 may function in tandem as a waveguide for the RF electromagnetic radiation.

In some implementations, the photonic crystal structure 456 defines a photonic band gap for the example receiver 450. For example, the photonic crystal structure 450 may define a photonic band gap associated with a transverse magnetic (TM) mode of RF electromagnetic radiation. In another example, the photonic crystal structure 456 may define a photonic band gap associated with a transverse electric (TE) mode of RF electromagnetic radiation. Combinations of TM and TE modes for RF electromagnetic radiation are also possible.

In some implementations, the photonic crystal structure 456 is configured to decrease a group velocity of a target RF electromagnetic radiation having a frequency in a range from 100 MHz-1 THz. Such configuration may involve selecting a size of one or more cavities in the array of cavities 454, selecting a spacing of one or more cavities in the array of cavities 454, selecting an ordering of the array of cavities 454, and/or selecting a thickness of the dielectric body 452. Other characteristics are possible (e.g., selecting the material of the dielectric body 452). In some cases, the configuration of the photonic crystal structure 456 may be determined through numerical modeling. An example configuration for decreasing a group velocity of a target RF electromagnetic radiation is described below in relation to FIGS. 9, 11A-11B, and 14A-14C.

In some implementations, the photonic crystal structure 456 is configured to concentrate a target RF electromagnetic radiation in the elongated slot 460. The target RF electromagnetic radiation has a frequency in a range from 100 MHz-1 THz. Such configuration may involve selecting a size of one or more cavities in the array of cavities 454, selecting a spacing of one or more cavities in the array of cavities 454, selecting an ordering of the array of cavities 454, and/or selecting a thickness of the dielectric body 452. Other characteristics are possible (e.g., selecting the material of the dielectric body 452). In some cases, the configuration of the photonic crystal structure 456 may be determined through numerical modeling. An example configuration for concentrating a target RF electromagnetic radiation in an elongated slot is described below in relation to FIGS. 10A-10B and 14A-14C.

In some implementations, the photonic crystal structure 456 may include a photonic crystal mirror configured to redirect (e.g., reflect) a target RF electromagnetic radiation. For example, the array of cavities 454 may include one or more offset cavities that are spatially offset from an ideal periodic position in the array 454. The one or more offset cavities may define the photonic crystal mirror. In some variations, the one or more offset cavities reside nearest an end of the elongated slot and have respective spatial offsets away from the end of the elongated slot. In some variations, the one or more offset cavities reside nearest a side of the elongated slot and have respective spatial offsets away from the side of the elongated slot.

The example receiver 450 may also include a vapor or a source of the vapor in the elongated slot 460. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, irradiation by laser light, and so forth. For example, the vapor may correspond to a gas of alkali-metal atoms and the source of the vapor may correspond to an alkali-metal mass sufficiently cooled to be in a solid or liquid phase when disposed into the elongated slot 460.

The example receiver 450 may additionally include an optical window 466 covering the elongated slot 460 and having a window surface bonded to the surface 464 of the dielectric body 452 to form a seal about the slot opening 462. The optical window 466 may be bonded to the dielectric body 452 using a contact bond, an anodic bond, a glass frit bond, and so-forth. Such bonds may be formed using techniques described in U.S. Pat. No. 10,859,981 entitled "Vapor Cells Having One or More Optical Windows Bonded to a Dielectric Body," the disclosure of which, is incorporated herein by reference in its entirety. The optical window 466 may be formed of a material that is transparent to electromagnetic radiation (e.g., laser light) used to probe the vapor. For example, the optical window 466 may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the optical windows 466 may be an insulating material having a high resistivity, e.g., $\rho > 10^3$ $\Omega \cdot cm$, and may also correspond to a single crystal material, a polycrystalline material, or an amorphous (or glass) material. For example, the material of the optical window 466 may include silicon oxide (e.g., $SiO_2$, $SiO_x$, etc.), such as found within quartz, vitreous silica, or a borosilicate glass. In another example, the material of the optical window 466 may include aluminum oxide (e.g., $Al_2O_3$, $Al_xO_y$, etc.), such as found in sapphire or an aluminosilicate glass. In some instances, the material of the optical window 466 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLn_2Ti_4O_{12}$, etc.). In other instances, the material of the optical window 466 is a non-oxide material such as diamond (C), calcium fluoride (CaF), and so forth.

In some implementations, the optical window 466 covers only the elongated slot 460 and the surface 464 of the dielectric body 452 immediately adjacent the elongated slot 460 (e.g., the region 458 or portion thereof). However, in some implementations, the optical window 466 also covers the surface 464 of the dielectric body 452 associated with the photonic crystal structure 456. In these implementations, such as shown in FIG. 4B, the surface 464 of the dielectric body 452 defines a cavity opening for each of the array of cavities 454. The optical window 466 covers each of the cavity openings. Moreover, the window surface of the optical window 466 forms a seal about each of the cavity openings.

In implementations where the elongated slot 460 extends only partially through the dielectric body 452, a single optical window may be bonded to the dielectric body 452 to seal the vapor or source of the vapor in the elongated slot 460. However, in some implementations, the elongated slot 460 may extend through the dielectric body 452. In these implementations, two optical windows may be bonded to the dielectric body 452 to seal the vapor or source of the vapor in the elongated slot 460. For example, the surface 464 of the dielectric body 452 may be a first surface and the dielectric body 452 may include a second surface opposite the first surface. The elongated slot 460 may then extend through the dielectric body 452 from the first surface to the second surface. In this case, the slot opening 462 may be a first slot opening and the second surface of the dielectric body 452 may define a second slot opening of the elongated slot 460. The example receiver 450 may include a second optical window 468 covering the second slot opening, as shown in FIG. 4B. The second optical window has a second window surface bonded to the second surface of the dielectric body 452 to form a seal about the second slot opening.

In some implementations, the second optical window covers only the elongated slot 460 and the second surface of the dielectric body 452 immediately adjacent the elongated slot 460 (e.g., the region 458 or portion thereof). However, in some implementations, the second optical window also covers the second surface of the dielectric body 452 associated with the photonic crystal structure 456. For example, the first and second surfaces of the dielectric body 452 may define, respectively, first and second cavity openings for each of the array of cavities 454. In this case, the array of cavities 454 extends through the dielectric body 452 from the first surface to the second surface. The second optical window may then cover, respectively, each of the second cavity openings, as shown in FIG. 4B. Moreover, the second window surface may form a seal about each of the second cavity openings.

In some implementations, the dielectric body 452 includes an antenna structure 470 extending from an end 472 of the dielectric body 452 and aligned with the elongated slot 460. For example, the antenna structure 470 may be a protrusion extending from the end 472 of the dielectric body 452 and terminating in a taper. The antenna structure 470 may be configured to couple to a target RF electromagnetic radiation having a frequency in a range from 100 MHz-1 THz. Such configuration may involve selecting a length of the antenna structure 470, which may be determined by numerical simulation for the target RF electromagnetic radiation. Other dimensions may also be involved, including ratios of dimensions, e.g., thicknesses, widths, length-to-width ratios, length-to-thickness ratios, and so forth. The configuration of the antenna structure 470 for coupling to a target RF electromagnetic radiation may also involve selecting a shape of the antenna structure 470 or a degree of curvature of the antenna structure 470. The shape, the degree of curvature, or both, may also be determined by numerical simulation.

In some variations, the antenna structure 470 includes a polarizer, which may be integral to the antenna structure 470. For example, the antenna structure 470 may include a narrow portion aligned with the elongated slot 460. The antenna structure 470 may also include an array of co-planar segments extending outward from the narrow portion and having a periodic spacing therealong. The array of co-planar segments is configured to filter (or select) a polarization of the target RF electromagnetic radiation.

In some variations, the antenna structure 470 includes one or more channels 474 defining a taper 476 internal to the antenna structure 470. The taper 476 is configured to couple electromagnetic radiation received by the antenna structure 470, e.g., the target RF electromagnetic radiation, to the elongated slot 460. To do so, the taper 476 may have an apex 478 aligned with the elongated slot 460. For example, the antenna structure 470 may be a protrusion extending from the end 472 of the dielectric body 452. In this case, the antenna structure 470 may include a V-shaped channel defining a taper internal to the protrusion. The taper may have a tip (or apex) offset from an end of the elongated slot 460 aligned therewith. In an alternate case, such as shown in FIG. 4B, the antenna structure 470 may include a Y-shaped channel in the protrusion that includes a base portion 474a and two branch portions 474b. The base portion 474a is aligned with the elongated slot 460 and terminates in an end offset from an end of the elongated slot 460. The two branch portions 474b split from the base portion 474a to define a taper internal to the protrusion (e.g., taper 476). Other configurations are possible for the taper 476.

In operation, the example receiver 450 receives RF electromagnetic radiation at the antenna structure 470 of the dielectric body 452. In some instances, the example receiver 450 couples the received RF electromagnetic radiation to the elongated slot 460 using the taper 476 internal to the antenna structure. The example receiver 452 also interacts with the received RF electromagnetic radiation with the photonic crystal structure 456. In such interaction, the photonic crystal structure 456 may decrease a group velocity of the received RF electromagnetic radiation along a direction parallel to the elongated slot 460. The photonic crystal structure 456 may also concentrate the received RF electromagnetic radiation in the elongated slot 460. The example receiver additionally passes input optical signals through the vapor in the elongated slot 460 to generate one or more output optical signals. The input optical signals may be produced by one or more lasers (e.g., a probe laser, a coupling laser, etc.). In some variations, the example receiver 450 may be used with a dish, such as the dish 502 described in relation to FIG. 5, to improve a sensitivity of the example receiver 450 to RF electromagnetic radiation.

In some implementations, passing the input optical signals includes propagating the input optical signals along an optical pathway defined by the elongated slot 460. In some implementations, passing the input optical signals includes reflecting the input optical signals off a mirror disposed at an end of the elongated slot. For example, the example receiver 450 may include a mirror 480 disposed at an end of the elongated slot 460. The mirror 480 may be angled relative to the optical pathway (e.g., angled at 45°), or as shown in FIG. 4B, be perpendicular to the optical pathway. Such orientations may allow the mirror 480 to direct light into the elongated slot 460, direct light along the elongated slot 460 through the vapor, and/or direct light out of the elongated slot 460. Example positions and orientations of the mirror 480 are described further in relation to FIGS. 8A-8E.

In some implementations, photonic crystal cavities and structures are ideal for integrating with alkali-based vapor cells by using methods for vapor cell bonding and machining. A photonic crystal structure that acts as a concentrating element for MHz-THz radiation can have cavities machined in it using lasers (e.g., a Protolaser R tool), mechanical machining, or deep reactive ion etching (DRIE). The cavities (e.g., an elongated slot) may subsequently be filled with vapor by, for example, sealing them in an alkali vapor environment, placing paraffin coated alkali atoms within them, and/or placing laser activated getter sources within them. A high-purity source of alkali atoms (e.g., a solid mass of alkali atoms) may also be placed directly into the cavities. The photonic structures can be designed to concentrate and bunch the incident high frequency electric field in the vapor. Slowing down and amplifying the RF radiation field in the vapor increases the optical read-out response, thereby making the device more sensitive to the incident electromagnetic wave. The sensitivity of the atoms to the incident electromagnetic field is determined by the interaction time with the incident RF electromagnetic field and the strength of the RF electromagnetic field at the position of the atoms. Both the slowing (decrease of the group velocity of the target electromagnetic wave) and the concentration of electric field in the slot of the photonic crystal receiver serve to enhance the sensitivity of the atoms to the target electromagnetic radiation by effectively increasing the strength of the electric field and the interaction time with the atoms. The photonic crystal structure is based on high dielectric constant materials (e.g., silicon) that can be contact bonded. Other high dielectric constant, low loss materials such as $BaLn_2Ti_4O_{12}$ (BLT) can be used, if adhesion layers are applied.

The photonic crystal receiver may function as a Rydberg atom-based radar receiver with an electric field sensitivity that is enhanced by a significant factor (e.g., a factor of approximate 1000, or another factor) compared to a bare vapor cell. The photonic crystal receiver may have a sensitivity at least equivalent to a conventional receiver and may be able to reach the thermal noise floor. Methods to fabricate the photonic crystal receiver include machining silicon and glass with lasers, thereby allowing the formation of microstructures in these materials with μm precision and less than 10 μm feature sizes. Such precision and feature scales are well suited for photonic crystal frames that interact with a radio frequency field, since the wavelength of the radio frequency field is much greater than 10 μm. The high accuracy of the machining process in relation to the wavelength of the target radiation may also reduce loss in the device.

The use of Rydberg atoms for electrometry has already led to the most accurate, absolute measurements of high frequency (GHz-THz) electric fields to date, ~1 μV/cm. The calculated atomic shot noise limit in the 5-25 GHz range is ~pV cm$^{-1}$ Hz$^{-1/2}$, for standard interaction volumes, determined by the number of participating atoms and the coherence time. The current sensitivity limits are determined by shot noise in the classical readout field. Conventional vapor cells used to demonstrate dielectric Rydberg atom-based sensing devices cannot be improved in sensitivity without using additional quantum resources (e.g., entanglement or squeezed light), which are presently impractical. A path forward to improve the sensitivity for a broad range of transformative communications and radar applications is to engineer the vapor cell to enhance the signal. The signal levels in a bare vapor cell are limited because ultimately the interaction of the atom with the incident electromagnetic field is determined by the absorption rate (or interaction rate) times the coherence time, i.e., the coupling constant between the atom and the field and how fast the atom decays. However, amplifying the electromagnetic field in the region of the atoms by concentrating it and slowing it down is a viable path forward to make a more sensitive receiver since these effects increase atomic response to the incident electromagnetic field amplitude. Precision manufacturing is advantageous, for example, to design these structures for specific frequencies, construct self-calibrated devices, and tailor the output signals.

In many variations, the photonic crystal receivers are formed of dielectric materials, thereby allowing the photonic crystal receivers to be clustered together with minimal interference and cross coupling. The photonic crystal receivers may sense different frequencies and polarizations. In many variations, the photonic crystal receivers have increased polarization sensitivity and may be capable of discriminating less than 0.05 degrees of polarization rotation. Polarization rotation discrimination refers to how much the polarization would have to rotate in order to resolve a change with a receiver.

In many variations, the sensitivity of the photonic crystal receivers is greater than −120 dBm with a 1 MHz bandwidth. The sensitivity does not include enhancements from a dish, which can further increase the sensitivity and is commonly used with a conventional receiver. For example, the photonic crystal receivers can support −110 dBm in a 1 MHz bandwidth at a center frequency of around 15 GHz. A 1 m² dish for this center frequency can increase the sensitivity of the photonic crystal receivers by close to three orders of magnitude.

In many variations, the photonic crystal receivers are lightweight, portable, and less costly. The photonic crystal receivers may be based on diode laser technology and vapor cell technology. Reducing size, weight, and power (SWaP) is an important driver for many applications (e.g., telecommunication systems, modern radar systems, etc.). In many variations, the photonic crystal receivers are constructed so that they can be manufactured more easily than glass blown structures associated with conventional vapor cells. As such, the photonic crystal receivers are more robust, such as to mechanical forces, vibrations, and so forth.

In some implementations, the photonic crystal receivers may serve as receivers for radar because the bandwidths, pulse repetition rates, low SWaP, and advantages of being dielectric and polarization sensitive are well-suited for radar applications. Radar systems often use pulse repetition rates of ~100 Hz-100 kHz with pulse widths of ~1 ms-10 ns. These pulse widths translate to signal bandwidths ranging from kHz to 100 MHz. Photonic crystal receivers that, in many variations, utilize Rydberg atom-based sensing can meet these performance levels.

Figure 6:
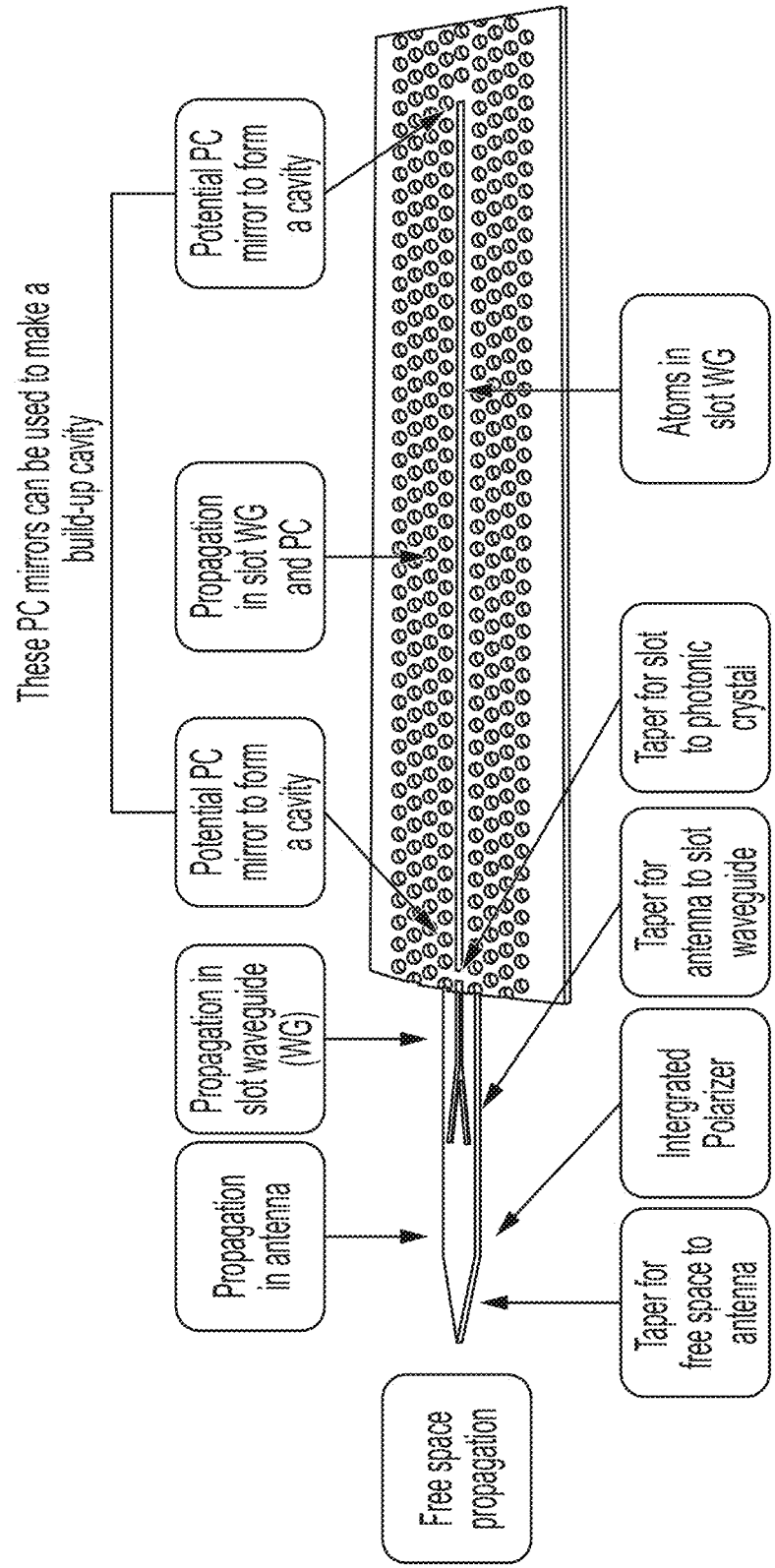
FIG. 6 is a schematic diagram of an example photonic crystal frame that includes a protrusion for receiving electromagnetic radiation and a periodic arrangement of holes.
Figure 7:
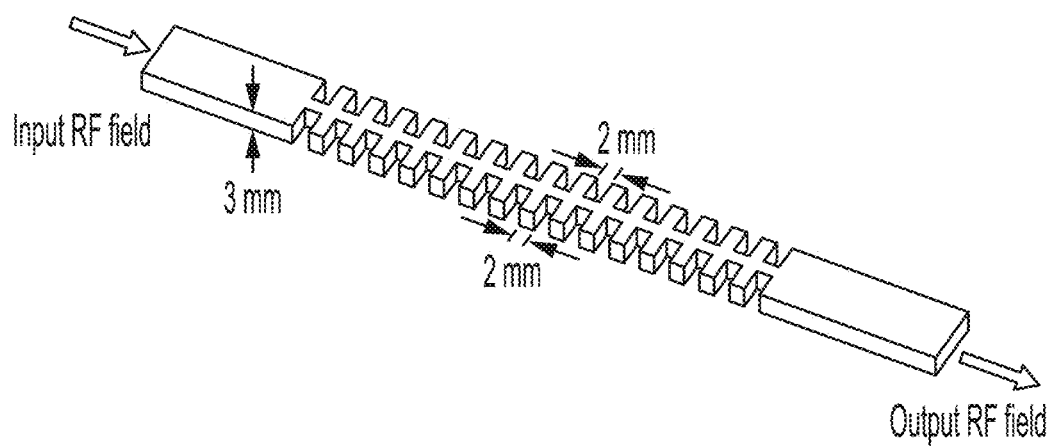
FIG. 7 is a schematic diagram of an example protrusion (or portion thereof) of a photonic crystal frame that includes a periodic array of segments disposed along a narrowed section of the example protrusion that serves as a polarizer.

Now referring to FIG. 6, a schematic diagram is presented of an example photonic crystal frame that includes a protrusion for receiving electromagnetic radiation and a periodic arrangement of holes. The protrusion may be configured to receive a target RF electromagnetic radiation and may include one or more tapered surfaces. In some variations, the protrusion may be configured to filter a polarization of the electromagnetic radiation. For example, FIG. 7 presents a schematic diagram of an example protrusion (or portion thereof) of a photonic crystal frame that includes a periodic array of segments disposed along a narrowed section of the example protrusion. The example protrusion may be 3 mm thick. However, other thicknesses are possible. Each segment extends outward and perpendicular to the narrowed section. The segments are spaced equally from each other by gaps, and the dimensions of the gaps may be the same as the dimensions of the segments. In some variations, the segments and gaps have a width of 2 mm. However, other dimensions are possible. The periodic array of segments is operable to filter a polarization of an input electromagnetic radiation (e.g., an RF field) and produce a filtered output electromagnetic radiation (e.g., a filtered RF field).

Now referring back to FIG. 6, the example photonic crystal frame also includes a line defect disposed in the periodic arrangement of holes that slows the target electromagnetic wave (so-called structural slow light). The line defect may correspond to a row of "filled" holes—e.g., the absence of holes—in the periodic arrangement of holes. A linear cavity may be centered within the line defect that defines a photonic crystal waveguide. Mirrors (e.g., Bragg mirrors) at each end of the linear cavity may help to define an optical pathway along the linear cavity, such as for probe and coupling laser beams. The probe and coupling laser beams may be used in electromagnetically induced transparency read-out in Rydberg atom-based sensing. A vapor may occupy the linear cavity, such as a vapor of Group IA atoms (e.g., Cs, Rb, etc.). The vapor in the linear cavity is operable to interact with the target electromagnetic radiation incident on the example photonic crystal frame, which may be enhanced or intensified in the linear cavity. Optical signals (e.g., laser beams) traveling along the optical pathway may also interact with the vapor in the linear cavity, thereby transducing the atomic interaction with the target electromagnetic field into an optical signal suitable for determining properties of the target electromagnetic field (e.g., amplitude, phase, polarization, etc.).

The optical signals may enter and exit the linear cavity through fiber optic assemblies, and in some variations, one or more mirrors disposed in the linear cavity. For example, FIGS. 8A-8E present schematic diagrams, in cross-section, of alternate configurations of a photonic crystal receiver, each configuration having a different arrangement of fiber optic assemblies. The cross-sections are illustrated from a side perspective (i.e., holes parallel to the short dimension of FIGS. 8A-8E). The photonic crystal receiver includes a photonic crystal frame with a vapor (e.g., a vapor of Cs atoms) in a cavity. The cavity may extend from a first end to a second end along an axis (e.g., a linear axis) that is associated with an optical pathway. Depending on the configuration, the photonic crystal receiver may include one or two fiber optic assemblies coupled to the photonic crystal frame in optical communication with the optical pathway. In some configurations, such as shown in FIGS. 8B-8E, one or both of the first and second ends of the cavity include a mirror (e.g., a Bragg mirror). The mirror is operable to guide light along the optical pathway. The mirror may reflect light from an input fiber optic assembly into the cavity, reflect the light out of the cavity into an output fiber optic assembly, or both. The light may correspond to optical signals entering and exiting the cavity. The mirrors can be glued, precision-fit, or machined into the frame and coated to locate them into the channel.

The example photonic crystal frame may be formed of silicon. However, other types of dielectric materials may be used. The example photonic crystal frame may also be sandwiched between and bonded to two optical windows. The optical windows may be formed of an optically transparent dielectric material, such as glass (e.g., fused silica, borosilicate glass, etc.). When bonded to the optical windows, the example photonic crystal frame (with a vapor in the linear cavity) may be configured as a photonic crystal receiver. It is also possible to bond smaller windows to the photonic crystal frame where the light is injected into the channel. For example, a silicon cap with holes at the position where the light enters the channel can be bonded to the photonic crystal frame. Optical windows can be bonded to the silicon cap where the holes for light injection are located.

In some instances, photonic crystal receivers provide a compact, all-dielectric construction and out-perform current receivers in functionality, e.g., electromagnetic transparency, self-calibration, and SWaP. Moreover, several photonic crystal receivers can be grouped together without interfering with one another because of their dielectric nature. Fully dielectric receivers are beneficial in many applications, such as in radar and communications. Advantages of a photonic crystal receiver based on Rydberg atom-based sensing technology may include, in various implementations, one or more of the following: [1] the receiver can act as its own filter, [2] there are no amplifiers required to reach the standard performance, [3] multiple receivers can be grouped together with minimal interference and cross-coupling, [4] the receiver can be sensitive to polarization, and [5] the receiver is self-calibrated. Other advantages are possible. Grouping of photonic crystal receivers to sense orthogonal polarizations of return signals, even at different frequencies is possible. The small, compact size, use of diode lasers and low power electronics, and elimination of a power amplifier are advantages for portable and compact radar systems, particularly multi-static ones, as well as communication systems (e.g., telecommunications).

In some implementations, a photonic crystal receiver is configured for weather radar applications. The photonic crystal receiver, when constructed of dielectric materials, can be more polarization sensitive than conventional metal antennas. Increasing the polarization sensitivity can lead to better discrimination of object shapes. Waveguides can be highly polarization sensitive, especially with a polarizer segment integrated within the waveguide or the initial coupling stage. The increased accuracy on differential return, differential phase and correlations between different polarizations can allow models for quantitative precipitation estimates to become truly predictive. The photonic crystal receiver can use multiple frequencies, which further constrains models of rain, snow, and ice characterization. The prediction of weather, particularly for early warning in catastrophic conditions, like tornadoes and severe thunderstorms, is a multi-billion-dollar industry. In the United States, a better multi-frequency radar system, such as those allowed by the photonic crystal receiver, can possibly replace four different networks consisting of National Weather Surveillance Radar, Terminal Doppler Radar, Airport Surveillance Radar, and Air Route Surveillance Radar, and lead to enormous cost savings. In communications, there are similar applications such as a lightweight receiver that can identify the origin of emissions, allowing the identification of jamming signals; and multi-frequency communications systems that have to be located in compact spatial locations (e.g., drones).

In some implementations, a photonic crystal frame allows a photonic crystal receiver to improve electric field sensitivity by about 10 times by slowing electromagnetic radiation, by about 20 times from build-up in the cavity, and by about 30 times by concentrating a field of the electromagnetic radiation in a waveguide. Additional gains may be obtained from using larger numbers of atoms, since a cavity where the vapor, or atoms, reside can be made long, a factor of about 30 in the electric field sensitivity. All of these features can be realized in the same photonic crystal frame, in some cases. Since these aforementioned gains are quoted in terms of the electric field sensitivity, the sensitivity improvement in terms of power, which is typically used to characterize radar receivers, increases as the square of these numbers and can be greater than $10^6$.

Figure 9:
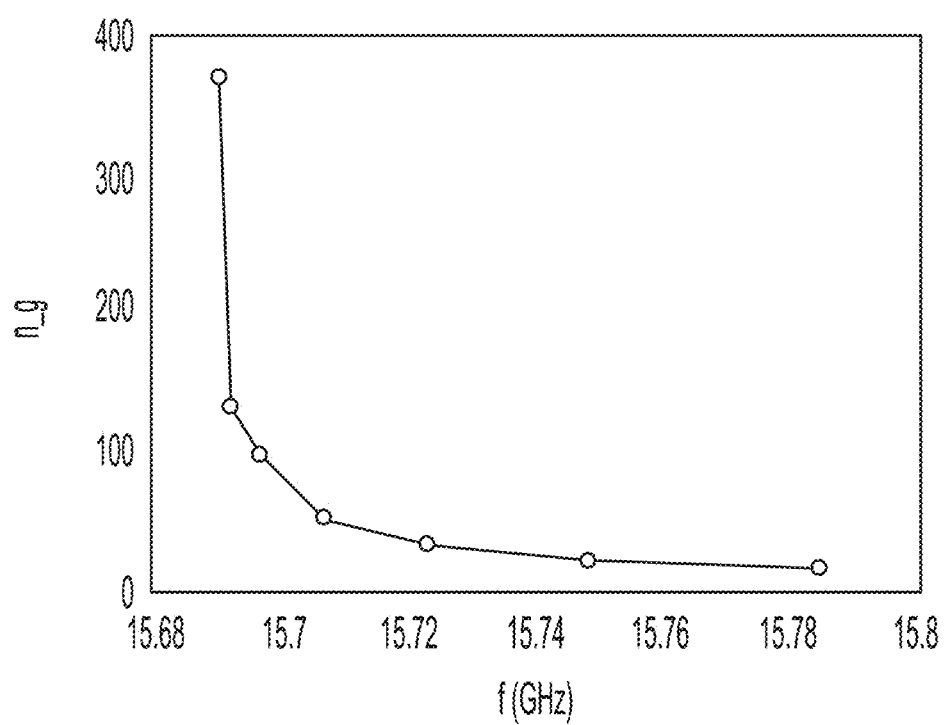
FIG. 9 is a graph of the group index of refraction ($n_g$), as a function of a frequency (f) of RF electromagnetic radiation, for the example photonic crystal receiver of FIG. 6.

For example, FIG. 9 presents a graph of the group index of refraction ($n_g$), as a function of a frequency (f) of RF electromagnetic radiation, for the example photonic crystal receiver of FIG. 6. The periodic arrangement of holes in the photonic crystal frame of the example photonic crystal receiver slows down a wave of the RF electromagnetic radiation. The velocity of the target RF electromagnetic wave is inversely proportional to $n_g$. In FIG. 9, the increase of $n_g$ is significantly below about 15.75 GHz and indicates frequencies of RF electromagnetic radiation (e.g., less than about 15.75 GHz) that the photonic crystal receiver is well-suited to receive. The photonic crystal waveguide may enhance the sensitivity to the target RF electromagnetic radiation (or electric field component thereof) through field confinement in the elongated slot. The sensitivity may also be enhanced through slowing down the target RF electromagnetic wave, where $n_g=c/v_g$. Here, c is speed of light in vacuum, and $v_g$ is the group velocity of the target RF electromagnetic wave in the photonic crystal. As shown in FIG. 9, $n_g$ with values exceeding several hundred is feasible. There is a trade-off between the bandwidth of the device and the value of $n_g$. For higher $n_g$, the bandwidth is reduced. The example calculation shown in FIG. 9 shows that for $n_g$ between 100 and 130, the bandwidth of the device is about 5 MHz, well within the range used for modern radar systems and some communications systems.

Figure 10A:
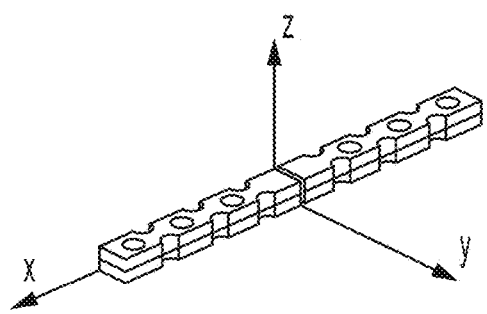
FIG. 10A is a unit cell of an example slotted photonic crystal waveguide.
Figure 10B:
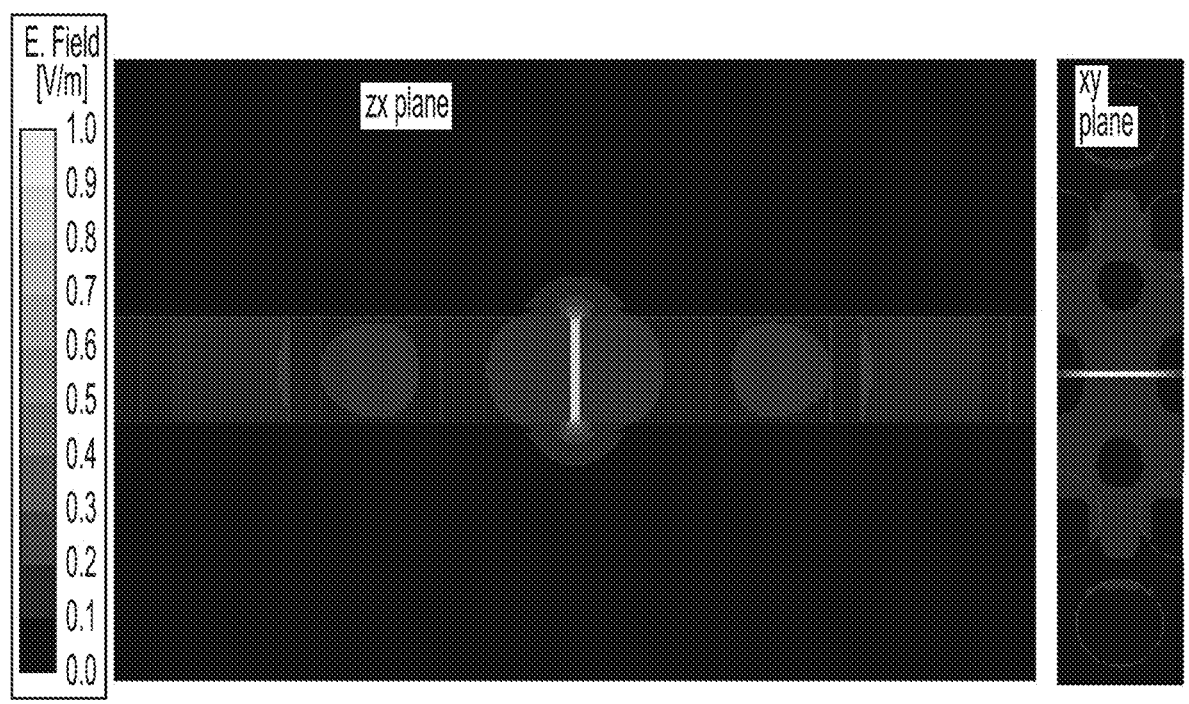
FIG. 10B is a simulation, shown by a contour graph, of an electric field in the unit cell of FIG. 10A.

FIG. 10A presents a unit cell of an example slotted photonic crystal waveguide. FIG. 10B presents a simulation, shown by a contour graph, of an electric field in the unit cell of FIG. 10A. The left contour graph corresponds to the zx plane of the unit cell, and the right contour graph corresponds to an xy plane of the unit cell. In the example shown, a single unit cell is sufficient for characterizing the example slotted photonic crystal waveguide. The contour graphs illustrate the build-up or concentration of the electric field in the linear cavity (or elongated slot) of the example slotted photonic crystal waveguide, as represented by the unit cell. The amplification of the electric field in this example is around 30 times.

Figure 11A:
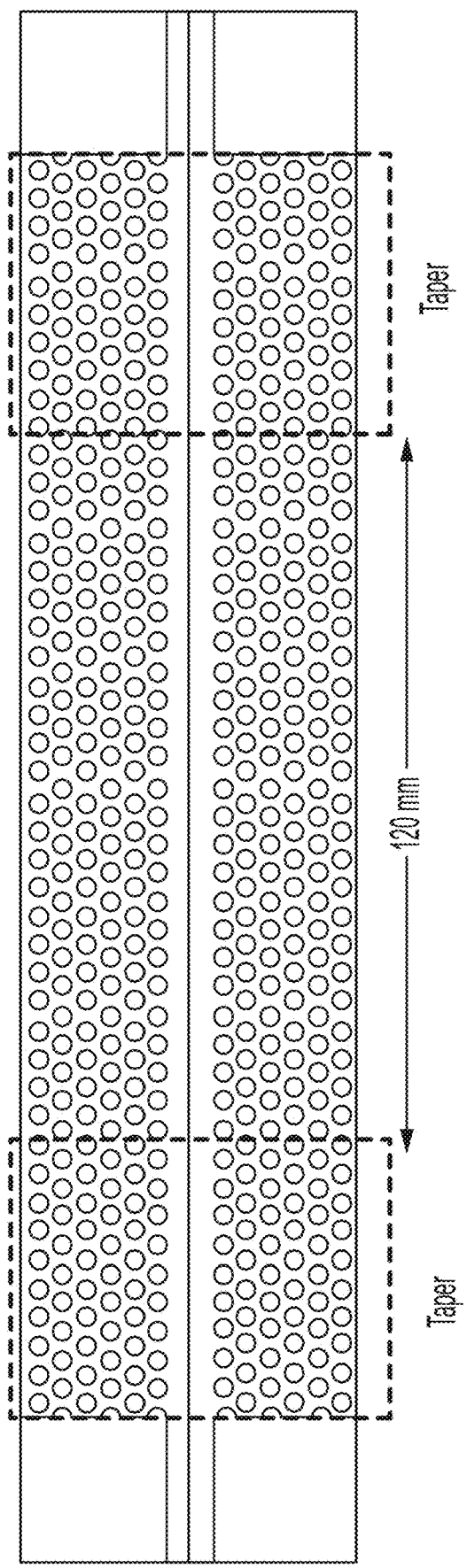
FIG. 11A is a schematic diagram of an example photonic crystal frame that includes a photonic crystal structure defined by a periodic arrangement of holes.
Figure 11B:
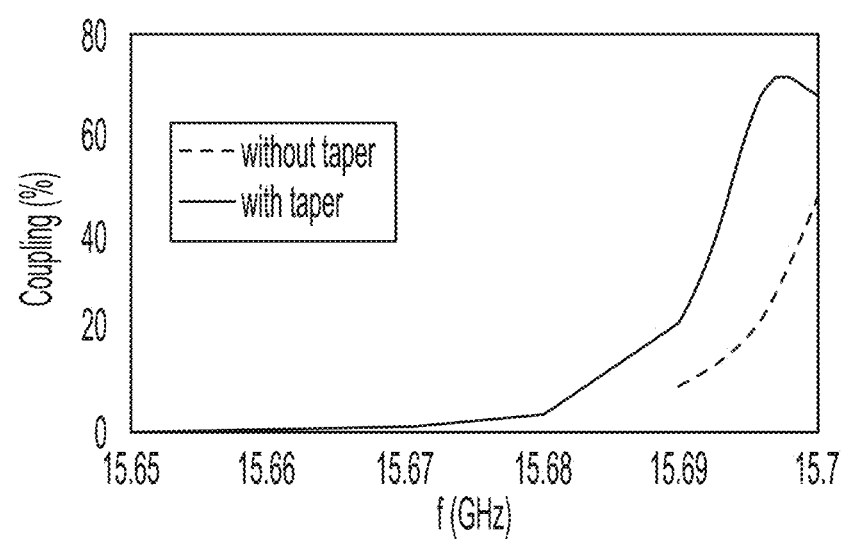
FIG. 11B is a graph showing a simulated transmission loss at a frequency of 15.697 GHz over a bandwidth of 50 MHz for a degree of tapering in the periodic arrangement of holes of FIG. 11A.

The photonic crystal receivers may include features to minimize coupling losses between the target electromagnetic radiation and the photonic crystal waveguide. For example, holes in the periodic arrangement of holes may be offset from their ideal periodic positions to adjust $n_g$. Such offset, especially adjacent a cavity or slot waveguide, may define a tapering of the holes to provide impedance-matching. FIG. 11A presents an example photonic crystal frame that includes a photonic crystal structure defined by a periodic arrangement of holes. The periodic arrangement of holes is configured to slow down electromagnetic radiation received by the example photonic crystal frame. FIG. 11B presents a graph at a frequency interval of 50 MHz, showing a simulated transmission loss for a degree of tapering in the periodic arrangement of holes of FIG. 11A. In FIG. 11A, the example photonic crystal frame is illustrated back-to-back in order to show the loss due to slowing down of the electromagnetic radiation (or RF wave). The photonic crystal group velocity is changed along the example photonic crystal frame to maximize the coupling into the structure, which minimizes transmission losses.

Changing the photonic crystal group velocity can be done by modifying the distance of the holes to the slot waveguide in a controlled fashion. FIG. 11B shows that the photonic crystal frame with the gradual slowing of the RF wave exhibits less than 30% loss in transmission, while the loss for the unmodified structure is much larger, around 73%. Moreover, the loss over the useful bandwidth of the photonic crystal frame with the gradual slowing of the RF wave is uniform. An example design frequency of the photonic crystal waveguide is about 15.697 GHz. Coupling of the electromagnetic radiation to the photonic crystal structure is about 30% for the entire structure. As a result, a photonic crystal receiver based on the example photonic crystal frame of FIG. 11A can reach sensitivity levels of −110 dBm for a 1 MHz bandwidth, which is competitive with current metallic receivers. Such sensitivity levels are without using a dish. The sensitivity can be further increased by using a dish (e.g., dish 502 of FIG. 5), as is done with some conventional receivers, thereby improving the sensitivity of the example photonic crystal system. For example, the photonic crystal system may include the photonic crystal receiver and the dish which function cooperatively. A 1 $m^2$ dish can improve the sensitivity of the example photonic crystal frame at about 15 GHz by almost three orders of magnitude. Note that the thermal noise floor is about −140 dBm for a 1 MHz bandwidth. Coherent schemes can enable the detection of signals within the thermal noise floor, but it is generally not important to exceed sensitivities much beyond the thermal noise floor.

Polarization sensitivity generally depends on the strength of the return signal and at least two limiting factors. The limiting factors include the sensitivity limit of the receiver and the rejection ratio of the photonic crystal structure for horizontal polarization versus vertical polarization. Based on the sensitivity limit of some example designs and a target return signal power of 10 μW (−20 dBm), the minimum resolvable polarization angle is approximately the smallest detectable electric field/anticipated electric field to be detected ~$10^{-4}$ rad ~0.006 degrees of rotation. The rejection ratio between horizontal and vertical polarizations for the photonic crystal receiver shown in FIGS. 4A-4B and 6 may be about $10^{-3}$ rad~0.06 degrees. However, although not shown in FIGS. 4A-4B and 6, other configurations of the photonic crystal receiver include polarizers that can be added to a protrusion (or taper) from the photonic crystal frame (e.g., the periodic array of segments illustrated by FIG. 7). These polarizers can further increase the polarization selectivity by three to four orders of magnitude. Angular resolutions of <0.05 degrees can be achieved. These performance metrics are calculated without a dish, which can further amplify the signals and increase the polarization discrimination. Moreover, the vapor can also be used to discriminate polarization.

In some cases, the photonic crystal receivers may be paired with stable laser systems to realize a field-deployable unit. In some implementations, the photonic crystal receiver is optically coupled to a set of lasers tuned to fixed transitions of the vapor (e.g., a vapor of Cs atoms). For example, a photonic crystal receiver may be optically coupled to a distributed Bragg reflector (DBR) laser capable of emitting an 852-nm photon beam and a single pass doubled fiber laser capable of emitting a photon beam of about 510 nm in wavelength. The 510-nm wavelength is well-suited to interact with a vapor of cesium atoms. It is also possible to use a DBR or distributed feedback (DFB) laser that operates at 510 nm. A DBR or laser at 510 nm can decrease the size of the receiver system, increase stability, and reduce the power required to operate the receiver system. In some variations, a Fabry-Perot laser can be built as a filter cavity laser system at 510 nm. The Fabry-Perot filter cavity laser that we have constructed can provide up to 100 mW of power. The filter cavity laser has many of the advantages of a DBR or DFB laser (e.g., the reduction in the power required to run the receiver system). However, unlike a DBR or DFB laser, the filter cavity laser is typically not hermetically sealed during production and contains free-space optics. In some variations, the entire optical circuit of the photonic crystal receiver can be a fiber optic assembly.

Figure 8A:
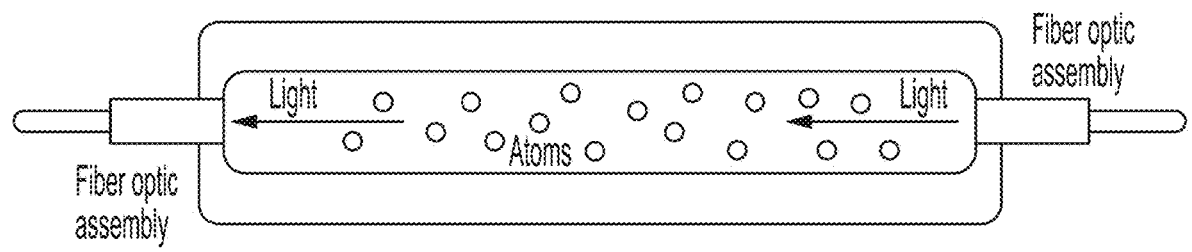
FIGS. 8A, 8B, 8C, 8D, and 8E are schematic diagrams, in cross-section, of alternate configurations of a photonic crystal frame, each configuration having a different arrangement of fiber optic assemblies coupled to a photonic crystal frame.
Figure 8B:
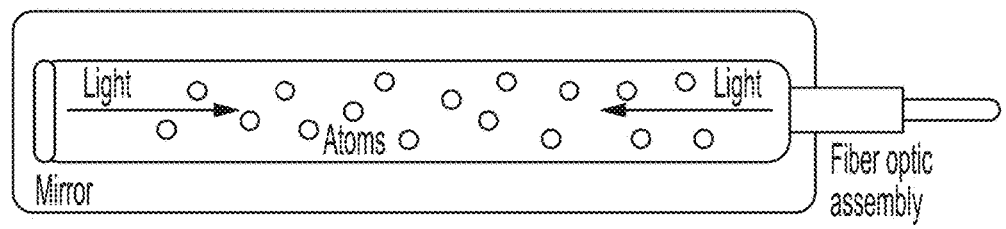
Figure 8C:
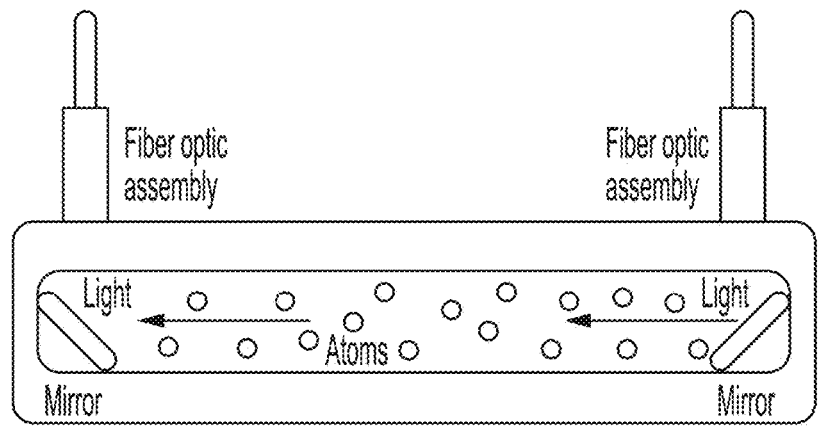
Figure 8D:
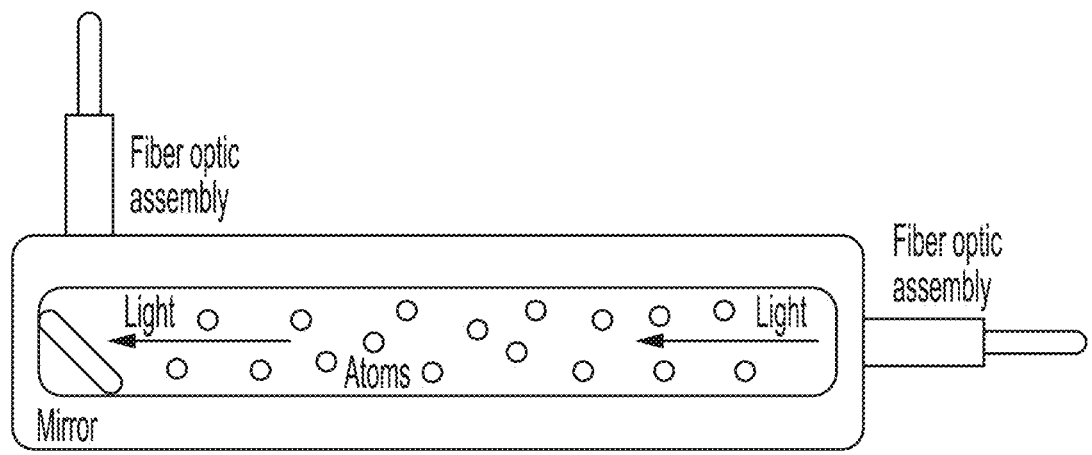
Figure 8E:
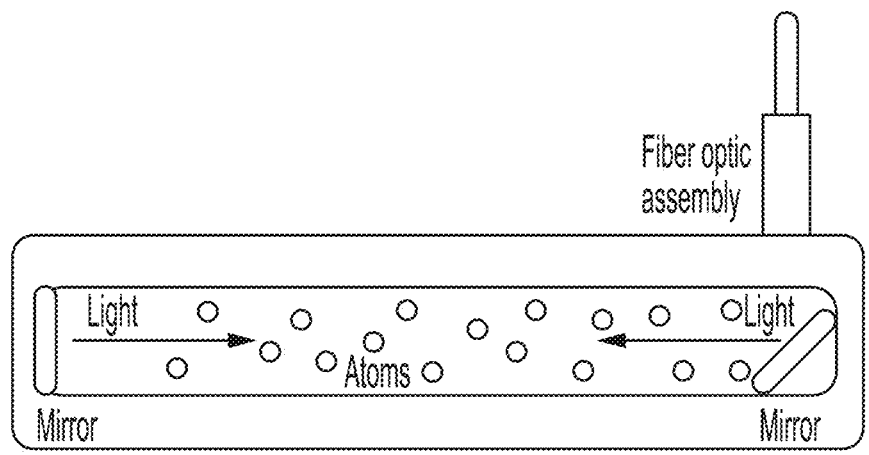

Light can be coupled into the cavity of the photonic crystal receiver in several different ways. In some instances, the light can be coupled into the cavity on the non-tapered side through an optical window, such as shown in FIGS. 4A-4B. A fiber and lens assembly can also be fused to the silicon frame (e.g., as shown in FIGS. 8A-8E). Light can also be coupled in from the side of the structure using small mirrors on a groove assembly. Small 45-degree mirrors can be placed in the RF waveguide and aligned with a side coupling assembly (e.g., as shown in FIGS. 8C-8E). All of these configurations can also be used to optically couple the probe light to the cavity or RF waveguide, which measures the transparency of the cesium gas. Filters may be used to eliminate unwanted light. In some applications, it may be advantageous to retroreflect the light back down the slot so that the out-coupled probe light returns along the in-coupling path (e.g., as shown in FIGS. 8B and 8E).

One of the challenges of making photonic crystal receivers is the accuracy needed to machine the photonic crystal structures. Laser machining may be used to build components of the photonic crystal receivers at accuracies of 2 μm. Feature sizes may be as small as 10 μm. These dimensions are small enough to machine the components needed to construct the receiver, 1 part in $10^4$ of the wavelength for 15 GHz. A photonic crystal receiver scales with wavelength, and the receiver can be scaled to other electromagnetic frequencies. The photonic crystal receiver may be constructed by machining a frame from a dielectric material, such as silicon, and bonding optical windows to the frame after the slot has been filled with cesium vapor. The cesium vapor may be filled from a background vapor, depositing a paraffin coated drop of cesium in the vapor cell, or using a laser activated getter material (SAES). A high-purity source of cesium atoms (e.g., a solid mass of cesium atoms) may also be placed directly into the slot. In some manufacturing methods, a first optical window is bonded to the frame using anodic bonding. The frame is made of silicon. A second optical window is then contact bonded to the frame. However, in some variations, the second window is anodically bonded to the frame as well, as long as a fill hole is left open for introducing the vapor (e.g., a vapor of cesium atoms) into the cavity where the atoms reside. The fill hole can be sealed using a contact bond or an anodic bond. Contact bonds are used for the last seal because other bonding methods (e.g., anodic bonding) require high temperatures and voltages, which lead to outgassing of contaminate species. Rydberg atom electrometry exhibits high performance when the background gas density is small, such as around <$10^{-3}$ Torr since spectral broadening of Rydberg states is 200 MHz Torr$^{-1}$ for Nz. Other frame materials with high dielectric constants can also be used, such as BLT. Adhesion layers may be used with silicon or the other frame materials. Low loss materials at the operational frequency are also desirable. The holes for the photonic crystal frame can be cut straight through the glass and frame in a final step instead of cut through only the frame.

Figure 12A:
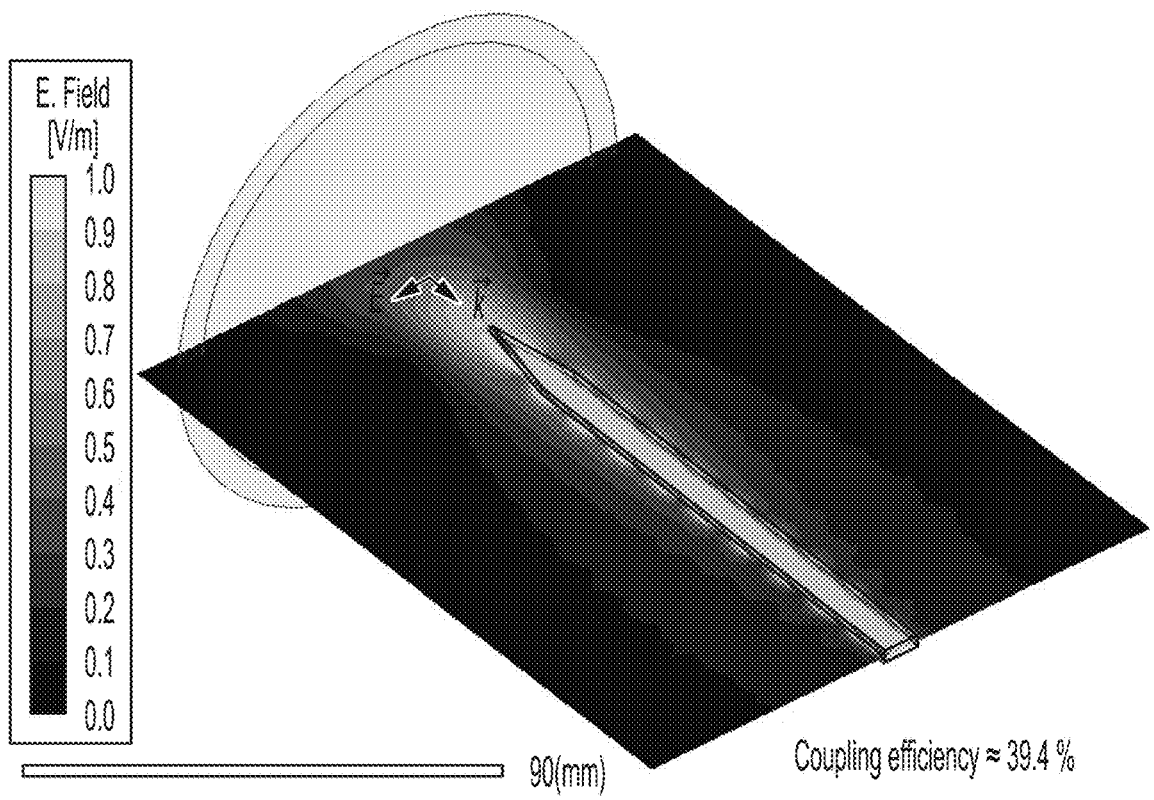
FIG. 12A is a contour graph of a simulated coupling of a 15.697 GHz electromagnetic wave to an example tapered waveguide using a parabolic dish.
Figure 12B:
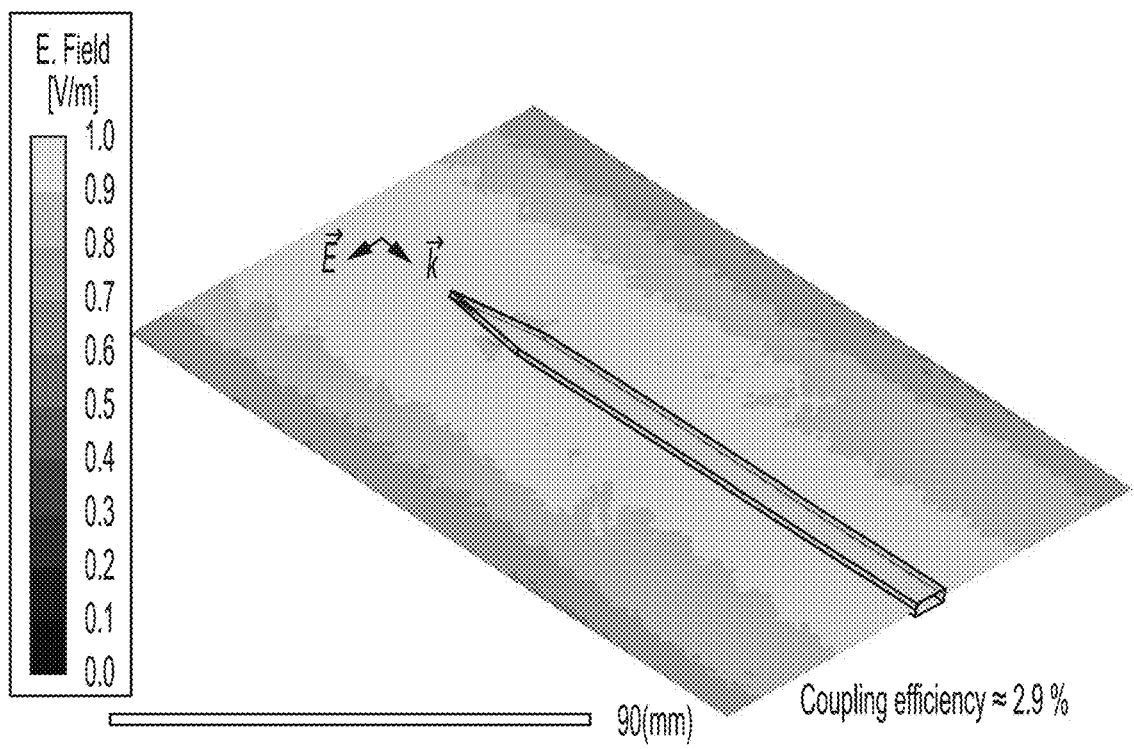
FIG. 12B is a contour graph of a simulated coupling of the 15.697 GHz electromagnetic wave of FIG. 12A to the example tapered waveguide, but in the absence of the parabolic dish and received as a plane wave.

As described in relation to FIGS. 4A-4B, a dish can increase the sensitivity of a photonic crystal receiver. FIG. 12A presents a contour graph of a simulated coupling of a 15.697 GHz electromagnetic wave to an example tapered waveguide using a parabolic dish. The dish can enhance the coupling by orders of magnitude compared to a plane wave. The focused Gaussian beam couples to the example tapered waveguide better and the dish captures a larger fraction of the incident plane wave. The example photonic crystal receiver may be configured similar to the example photonic crystal receiver described in relation to FIGS. 4A-4B. FIG. 12B presents a contour graph of a simulated coupling of the 15.697 GHz electromagnetic wave of FIG. 12A to the example tapered waveguide, but in the absence of the parabolic dish and received as a plane wave. The 15.697 GHz electromagnetic wave (or signal) is directed along a length of the linear cavity (or waveguide). A Gaussian focal spot is not optimized for the photonic crystal receiver. Optimization of the focal spot size can further increase the coupling of the target electromagnetic field intercepted by the dish into the photonic crystal receiver.

Figure 13A:
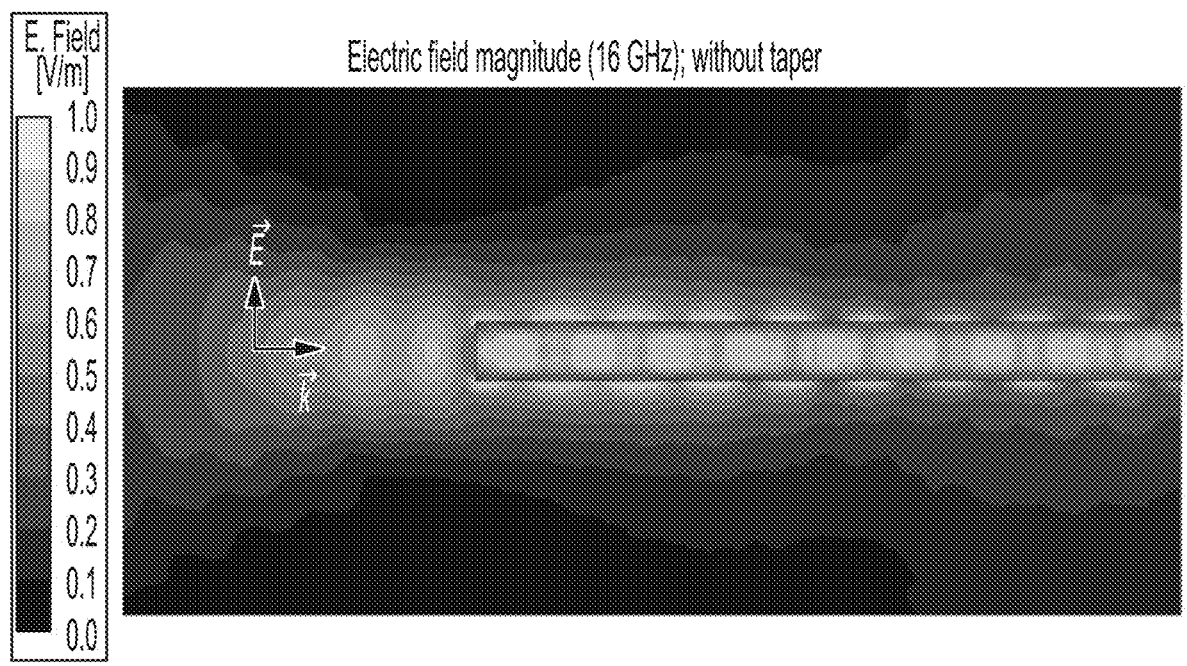
FIG. 13A is a simulated coupling efficiency of an incoming RF electromagnetic wave to an example non-tapered waveguide where the incoming RF electromagnetic wave is modeled as a Gaussian beam.
Figure 13A:
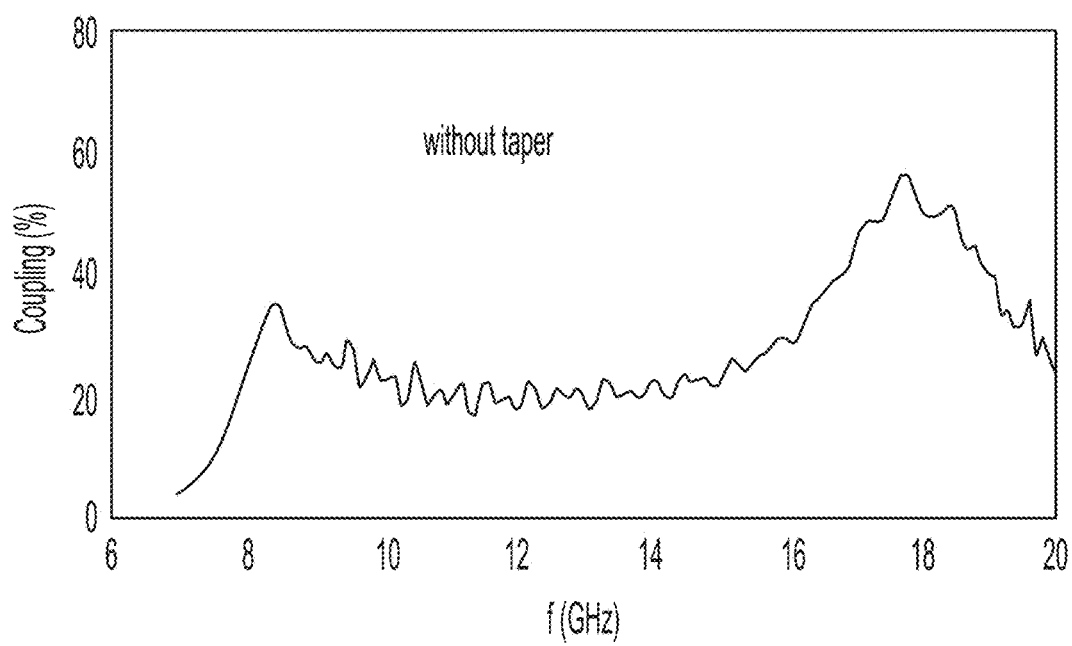
Figure 13B:
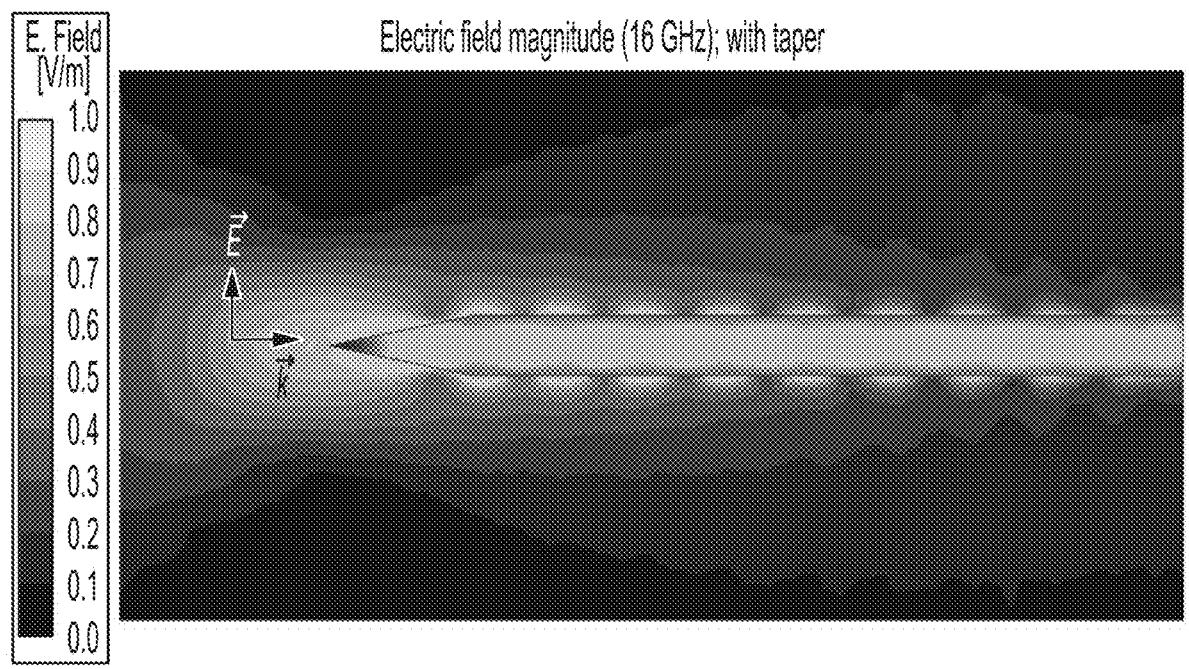
FIG. 13B is a simulated coupling efficiency of an incoming RF electromagnetic wave to an example tapered waveguide where the incoming RF electromagnetic wave is modeled as a Gaussian beam.
Figure 13B:
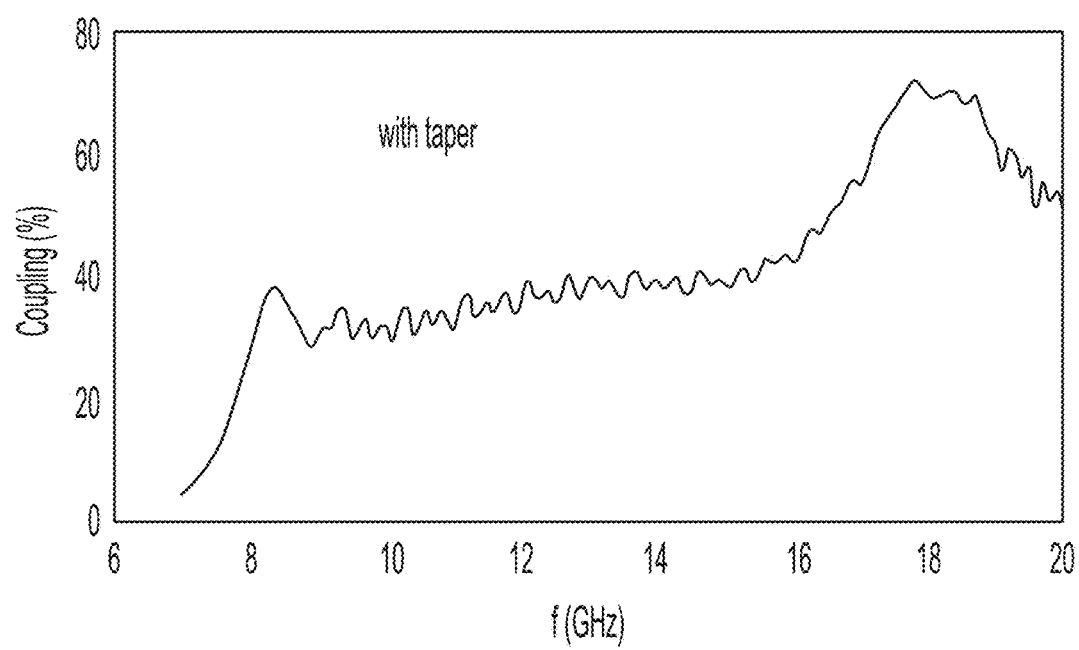

FIGS. 13A-13B present a simulated coupling efficiency of an incoming RF electromagnetic wave at 20 GHz to example waveguides (e.g., tapered vs. non-tapered). The example waveguides include a photonic crystal frame with an elongated slot and a periodic arrangement of holes therein. The contour graphs of FIGS. 13A-13B show an electric field strength of the incoming RF electromagnetic wave in a region that includes the waveguides. The contour graph of FIG. 13A is simulated with no taper in the waveguide, while the contour graph of FIG. 13B is simulated with a taper in the waveguide. Black lines in the contour graphs outline the waveguides, especially along the elongated slot. In FIG. 13B, the concentrated portion extends past an end of the waveguide into a triangular region.

The graphs of the coupling efficiency vs. frequency (i.e., lower half of FIGS. 13A-13B) show that the taper doubles the coupling efficiency over a majority of the frequency range, which is plotted from 13 GHz to 20 GHz. The incoming RF electromagnetic wave is modeled as a Gaussian beam, and the example photonic crystal receiver may be configured similar to the example photonic crystal receiver of FIGS. 4A-4B. The assumption of a Gaussian beam is consistent with the situation depicted in FIG. 5. In FIG. 5, the dish captures a return signal, which is nominally a plane wave at the position of the photonic crystal receiver since the target (or object) is far away. The parabolic shape allows the dish to focus the plane wave into the photonic crystal receiver. In receiving applications, such as for radar systems, it is typical that the source of the scattered RF electromagnetic field is very far from receiver, so the incoming RF field is a plane wave.

Figure 14A:
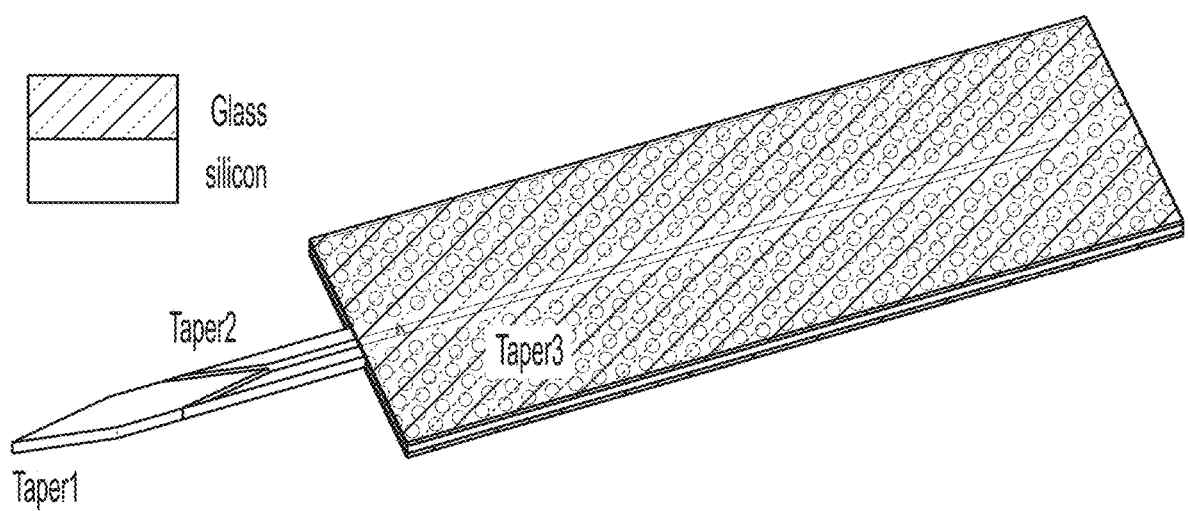
FIG. 14A is a schematic diagram, in perspective, of an example photonic crystal receiver having three tapers in a photonic crystal frame.

Now referring to FIG. 14A, a schematic diagram is presented, in perspective, of an example photonic crystal receiver having three tapers in a photonic crystal frame. A first taper and a second taper are associated with a protrusion from the photonic crystal frame. The first taper may define a transition for an electromagnetic wave from free space into a body of the photonic crystal frame. The second taper may improve the coupling of the electromagnetic wave into the waveguide in the photonic crystal frame. A third taper is associated with a spacing of the periodic arrangement of holes, such as described in relation to FIGS. 11A-11B and 13A-13B. The third taper helps to increase the coupling of the target electromagnetic wave into the slow wave structure, thereby reducing loss. The spacing of the periodic arrangement of holes may be represented by an inter-hole distance (or lattice constant), a, and a hole diameter, d. Example inter-hole distances and hole diameters for a silicon frame at various electromagnetic frequencies are presented below in Table 1. A height of the photonic crystal frame, which is formed of silicon, matches the hole diameter, d, for each frequency. However, heights that differ from the hole diameter are possible.

TABLE 1

| Frequency | a (lattice constant) | d (hole diameter) | $h_{silicon}$ |
|---|---|---|---|
| 5 GHz | 15 mm | 9 mm | 9 mm |
| 15 GHz | 5 mm | 3 mm | 3 mm |
| 20 GHz | 3.75 mm | 2.25 mm | 2.25 mm |
| 40 GHz | 1.9 mm | 1.1 mm | 1.1 mm |
| 80 GHz | 0.95 mm | 0.6 mm | 0.6 mm |

Figure 14B:
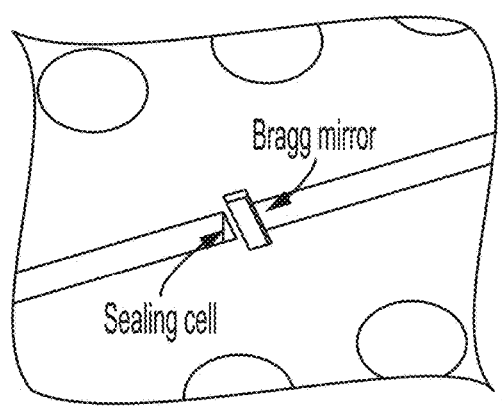
FIG. 14B is a detail view of a cavity portion of the example photonic crystal receiver of FIG. 14A.
Figure 14C:
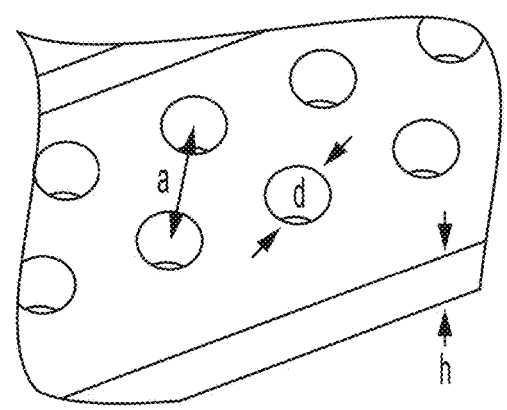
FIG. 14C is a detail view of a portion of a periodic arrangement of holes in the photonic crystal frame of the example photonic crystal receiver of FIG. 14A.

FIG. 14B presents a detail view of a cavity portion of the example photonic crystal receiver of FIG. 14A. The cavity portion includes a reflective mirror (e.g., a Bragg mirror) in a linear cavity. FIG. 14C presents a detail view of a portion of a periodic arrangement of holes in the photonic crystal frame of the example photonic crystal receiver of FIG. 14A. The spacing of the periodic arrangement of holes is shown in FIG. 14C, which illustrates the inter-hole distance (or lattice constant), a, the hole diameter, d, and the height of the photonic crystal frame, h.

Figure 15A:
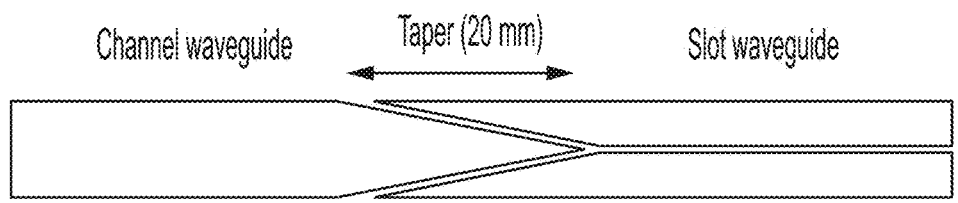
FIG. 15A is a detailed view, from a top-down perspective, of the second taper of FIG. 14A.
Figure 15B:
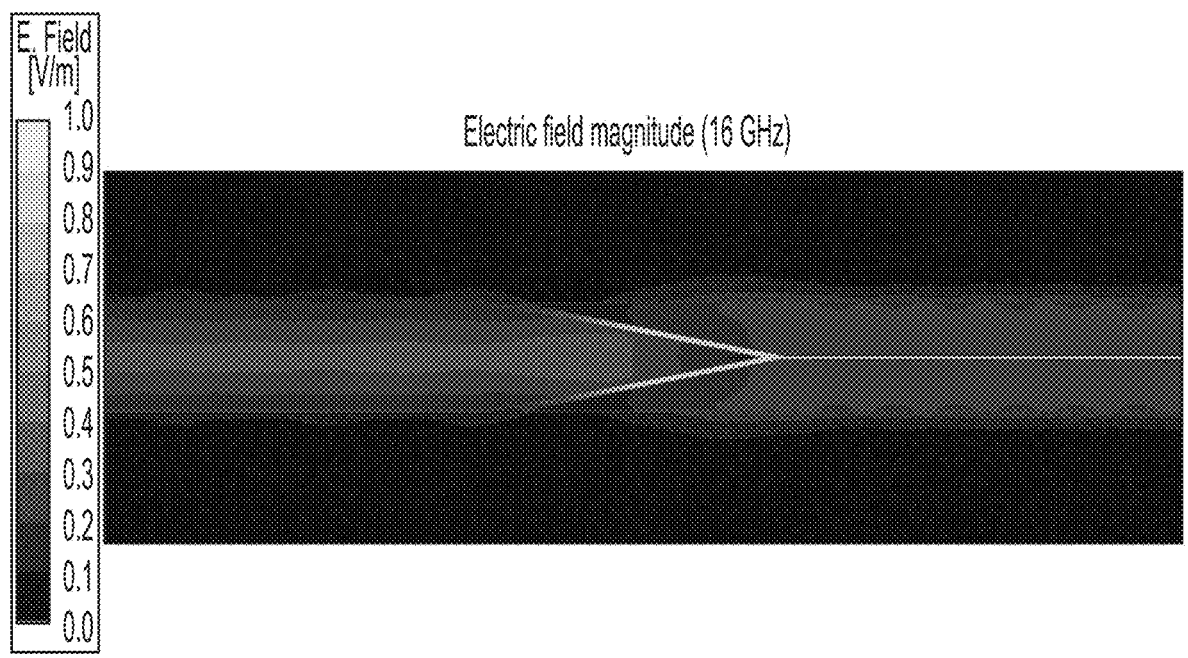
FIG. 15B is a contour map showing a simulated electric field strength of electromagnetic radiation leaving the second taper of FIG. 14A to enter a slot waveguide.
Figure 15C:
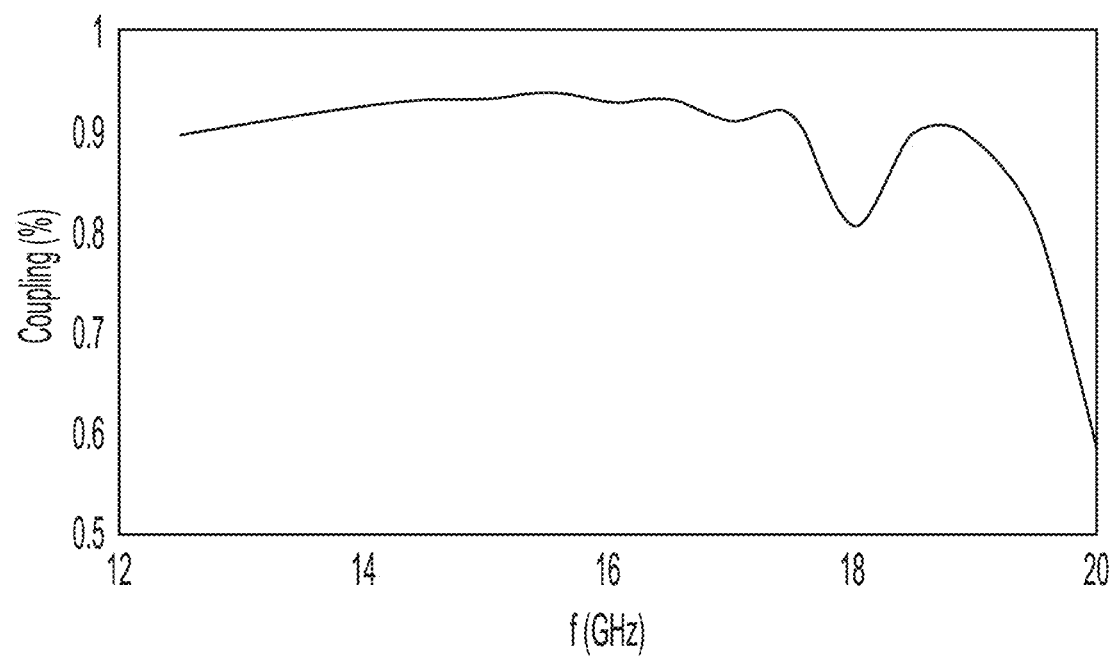
FIG. 15C is graph showing a simulated transmission loss when traversing the second taper of FIG. 14A from a channel to a slot waveguide.
Figure 16:
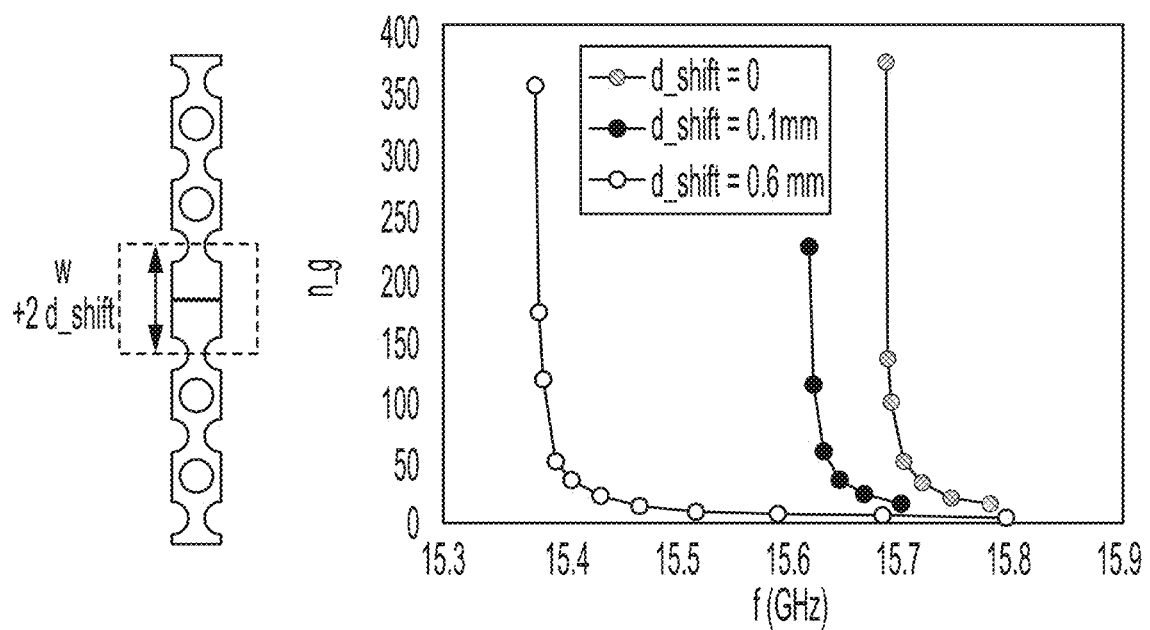
FIG. 16 is a schematic diagram of a section of an example photonic crystal frame and a graph showing a relationship between a group index of refraction ($n_g$) of the example photonic crystal frame versus a frequency (f) of RF electromagnetic radiation for various magnitudes of hole offsets.

FIG. 15A presents a detailed view, from a top-down perspective, of the second taper of FIG. 14A. The second taper may be operable to couple the channel waveguide to the slot waveguide. The coupling loss is less than 0.35 dB for a frequency range of 15 GHz to 16 GHz frequency range, as shown by FIGS. 15B & 15C. The coupling can be better than 92%. The dimensions of the photonic crystal, namely, d, the diameter of the holes, a, the periodicity or lattice constant of the holes, and, h, the thickness of silicon frame for a particular photonic crystal receiver are functions of a target RF electromagnetic field frequency. In order for the photonic crystal receiver to slow the target RF electromagnetic field in the line-defect region, the photonic crystal should have a bandgap near the desired design frequency. The device uses the dispersion that occurs near a photonic resonance that is designed into the photonic crystal by choosing the hole spacing, device thickness, and hole diameter. Other shapes of holes and parameters are possible. Table 1 provides representative design values for a silicon frame for these parameters for several frequencies.

For efficient coupling to the photonic crystal waveguide, a tapering in group index, $n_g$, is provided. As shown in FIG. 15, shifting (or tapering) the rows of holes adjacent to the slot region so that they are nearer or farther from each other can change $n_g$. With such a configuration, the coupling efficiency is about 72% into the slot waveguide, including all tapers, at 15.697 GHz. The shifting (or tapering) of the holes via hole offsets may be used to slow an electromagnetic wave down in a controlled manner so that the wave couples into the photonic crystal waveguide more efficiently.

Laser light to prepare and read-out the atoms can be coupled into and out of the photonic crystal receiver through free space, or through fiber coupling of the light to the photonic crystal frame. In some variations, the photonic crystal frame can include a mirror, such as Bragg mirror, at one end of the slot to direct laser beams down the slot so as to interact with the vapor. A mirror can be located at the other end of the channel as well. This additional mirror can be used to reflect the laser beams back along the channel where they can be separated by filters and beam splitters (e.g., a fiber beam splitter or circulator). The additional mirror can also be used to reflect the light from one or more of the lasers so as to couple it out of the device, such as with an alignment piece or groove assembly disposed between the device and the one or more lasers. The mirrors can be designed as filters to separate the different colors of light. It is also possible that there is a fiber coupler at both ends of the slot. In this case, the light is coupled into the guide at one end and received at the other end, without using mirrors in the slot. After the probe laser light—referring to Rydberg atom-based sensing configurations—leaves the channel, the probe laser light is transported to a photodetector and its optical signal processed to readout the strength, polarization, and phase of the incoming RF electromagnetic field as a function of time. Other parameters are possible.

Figure 17:
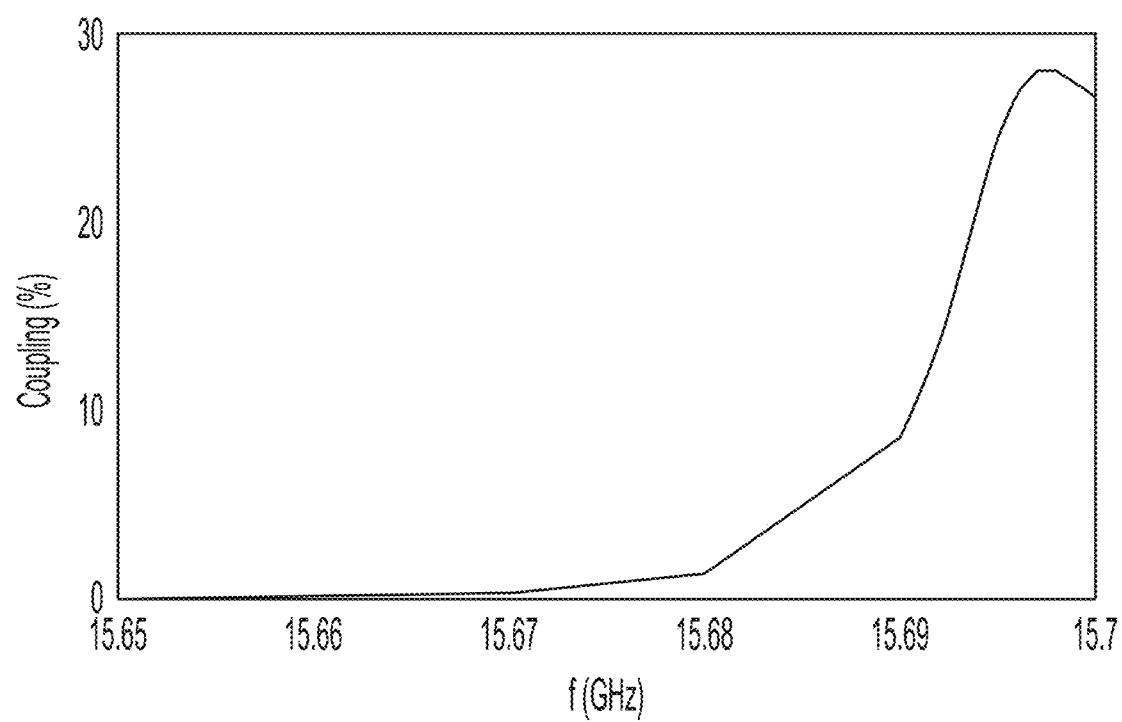
FIG. 17 is a graph of a simulated total coupling efficiency for the example photonic crystal receiver of FIG. 14A.

Now referring to FIG. 17, a graph is presented of a simulated total coupling efficiency for the example photonic crystal receiver of FIG. 14A. The ordinate of the graph shows a total coupling efficiency in percent and the abscissa of the graph shows a frequency of incoming RF electromagnetic radiation received by the example photonic crystal receiver. The total coupling efficiency represents the contribution of three tapers to the operation of the photonic crystal receiver, i.e., the first, second, and third tapers shown in FIG.

14A. The total coupling efficiency increases notably above 15.68 GHz, peaking at approximately 15.697 GHz.

In some aspects of what is described, a radar system may be described by the following examples:

Example 1. A radar system, comprising:
- a transmitter station configured to emit probe signals of RF electromagnetic radiation into a region; and
- a receiver station configured to process return signals of RF electromagnetic radiation from the region, the return signals based on probe signals scattered from one or more objects in the region, the receiver station comprising:
  - a photonic crystal receiver formed of dielectric material and comprising:
    - an antenna structure configured to couple to a target RF electromagnetic radiation, the return signals of RF electromagnetic radiation comprising the target RF electromagnetic radiation,
    - a photonic crystal structure having an elongated slot disposed therein and configured to concentrate the target RF electromagnetic radiation in the elongated slot, and
    - a vapor disposed in the elongated slot,
  - an optical system configured to generate spectroscopic data based on optical signals from the photonic crystal receiver, the spectroscopic data representing one or more properties of the target RF electromagnetic radiation, and
  - a data processing subsystem configured to generate a time series of property data based on the spectroscopic data, the time series of property data representing one or more properties of the target RF electromagnetic radiation over time.

Example 2. The radar system of example 1, wherein the time series of property data comprises amplitude data representing an amplitude of the target RF electromagnetic radiation over time.

Example 3. The radar system of example 1 or example 2, wherein the time series of property data comprises phase data representing a phase of the target RF electromagnetic radiation over time.

Example 4. The radar system of example 1 or any one of examples 2-3, wherein the time series of property data comprises frequency data representing a frequency of the target RF electromagnetic radiation over time.

Example 5. The radar system of example 1 or any one of examples 2-4,
- wherein the antenna structure comprises a polarizer configured to filter a polarization of the target RF electromagnetic radiation; and
- wherein the time series of property data comprises polarization data representing a polarization of the target RF electromagnetic radiation over time.

Example 6. The radar system of example 1 or any one of examples 2-5, wherein the data processing subsystem is further configured to determine, based on the time series of property data, a characteristic of a target object in the region.

Example 7. The radar system of example 6, wherein the characteristic comprises a location of the target object in the region.

Example 8. The radar system of example 6 or example 7, wherein the characteristic comprises a velocity of the target object.

Example 9. The radar system of example 6 or any one of examples 7-8, wherein the characteristic comprises a shape of the target object.

Example 10. The radar system of example 6 or any one of examples 7-9, wherein the characteristic comprises a composition of the target object.

Example 11. The radar system of example 1 or any one of examples 2-10,
- wherein the photonic crystal receiver is a first photonic crystal receiver and the receiver station comprises a second photonic crystal receiver;
- wherein a first antenna structure of the first photonic crystal receiver is configured to couple to a first frequency of the target RF electromagnetic radiation; and
- wherein a second antenna structure of the second photonic crystal receiver is configured to couple to a second, different frequency of the target RF electromagnetic radiation.

Example 12. The radar system of example 1 or any one of examples 2-11,
- wherein the photonic crystal receiver is a first photonic crystal receiver and the receiver station comprises a second photonic crystal receiver;
- wherein a first antenna structure of the first photonic crystal receiver comprises a first polarizer configured to filter a first polarization of the target RF electromagnetic radiation; and
- wherein a second antenna structure of the second photonic crystal receiver comprises a second polarizer configured to filter a second, different polarization of the target RF electromagnetic radiation.

Example 13. The radar system of example 1 or any one of examples 2-12, wherein the receiver station comprises an inertial navigation subsystem configured to determine a position of the receiver station.

Example 14. The radar system of example 1 or any one of examples 2-13, wherein the receiver station comprises a local clock subsystem configured to set one or both of a local reference time and a local reference phase for the receiver station.

Example 15. The radar system of example 14, comprising:
- a plurality of receiver stations comprising respective local clock subsystems; and
- a global clock station configured to exchange synchronization signals with the transmitter station and the local clock subsystem of each receiver station, the synchronization signals representing a global reference time and a global reference phase for the radar system.

Example 16. The radar system of example 1 or any one of examples 2-15, comprising:
- a plurality of receiver stations; and
- a data control center configured to communicate with the transmitter station and the plurality of receiver stations and to perform operations comprising:
  - generating processed data based on multiple time series of property data from respective receiver stations, the processed data representing a characteristic of the target object in the region, and
  - communicating the processed data to the transmitter station, one or more of the plurality of receiver stations, or both.

Example 17. The radar system of example 1 or any one of examples 2-16, wherein the optical system comprises a laser subsystem configured to provide, to the elongated slot, input optical signals that interact with one or more electronic transitions of the vapor.

Example 18. The radar system of example 1 or any one of examples 2-17, wherein the optical system comprises an optical detection subsystem configured to generate the spectroscopic data based on output optical signals from the elongate slot.

Example 19. The radar system of example 1 or any one of examples 2-18, wherein the transmitter station is a cooperative transmitter station configured to emit probe signals of RF electromagnetic radiation into the region in response to control signals.

Example 20. The radar system of example 1 or any one of examples 2-19, wherein the transmitter station is a non-cooperative transmitter station configured to passively emit probe signals of RF electromagnetic radiation into the region.

In some aspects of what is described, a radar method for detecting a target object in a region may be described by the following examples:

Example 21. A radar method for detecting a target object in a region, the radar method comprising:
- by operation a transmitter station, transmitting probe signals of RF electromagnetic radiation into the region;
- by operation a receiver station, processing return signals of RF electromagnetic radiation from the region, the return signals based on probe signals scattered from one or more objects in the region, wherein processing the return signals comprises:
  - at a photonic crystal receiver of the receiver station, receiving the return signals of RF electromagnetic radiation from the region, the photonic crystal receiver comprising:
    - an antenna structure configured to couple to a target RF electromagnetic radiation, the return signals of RF electromagnetic radiation comprising the target RF electromagnetic radiation,
    - a photonic crystal structure having an elongated slot disposed therein and configured to concentrate the target RF electromagnetic radiation in the elongated slot, and
    - a vapor disposed in the elongated slot;
- by operation of an optical system of the receiver station, generating spectroscopic data based on optical signals from the photonic crystal receiver, the spectroscopic data representing one or more properties of the target RF electromagnetic radiation; and
- by operation of a data processing subsystem of the receiver station, generating a time series of property data based on the spectroscopic data, the time series of property data representing one or more properties of the target RF electromagnetic radiation over time.

Example 22. The radar method of example 21, wherein the time series of property data comprises amplitude data representing an amplitude of the target RF electromagnetic radiation over time.

Example 23. The radar method of example 21 or example 22, wherein the time series of property data comprises phase data representing a phase of the target RF electromagnetic radiation over time.

Example 24. The radar method of example 21 or any one of examples 22-23, wherein the time series of property data comprises frequency data representing a frequency of the target RF electromagnetic radiation over time.

Example 25. The radar method of example 21 or any one of examples 22-24,
- wherein the antenna structure comprises a polarizer configured to filter a polarization of the target RF electromagnetic radiation; and
- wherein receiving the return signals comprises filtering a polarization of the return signals of RF electromagnetic radiation using the polarizer of the antenna structure.

Example 26. The radar method of example 25, wherein the time series of property data comprises polarization data representing a polarization of the target RF electromagnetic radiation over time.

Example 27. The radar method of example 21 or any one of examples 22-26, wherein processing the return signals comprises:
- determining, by operation of the data processing subsystem, a characteristic of the target object in the region based on the time series of property data.

Example 28. The radar method of example 27, wherein the characteristic comprises a location of the target object in the region.

Example 29. The radar method of example 27 or example 28, wherein the characteristic comprises a velocity of the target object.

Example 30. The radar method of example 27 or any one of examples 28-29, wherein the characteristic comprises a shape of the target object.

Example 31. The radar method of example 27 or any one of examples 28-30, wherein the characteristic comprises a composition of the target object.

Example 32. The radar method of example 21 or any one of examples 22-31, wherein processing the return signals comprises:
- passing, through the elongated slot, input optical signals that interact with one or more electronic transitions of the vapor; and
- receiving, at the optical subsystem, output optical signals from the elongated slot based on the input optical signals, the spectroscopic data generated based on the output optical signals.

Example 33. The radar method of example 21 or any one of examples 22-32,
- wherein the photonic crystal receiver is a first photonic crystal receiver and the receiver station comprises a second photonic crystal receiver;
- wherein a first antenna structure of the first photonic crystal receiver comprises a first polarizer configured to filter a first polarization of the target RF electromagnetic radiation;
- wherein a second antenna structure of the second photonic crystal receiver comprises a second polarizer configured to filter a second, different polarization of the target RF electromagnetic radiation; and
- wherein receiving the return signals comprises filtering a polarization of the return signals of RF electromagnetic radiation using the first and second polarizers of, respectively, the first and second antenna structures.

Example 34. The radar method of example 21 or any one of examples 22-33, wherein processing the return signals comprises determining, by operation of an inertial navigation subsystem of the receiver station, a position of the receiver station.

Example 35. The radar method of example 21 or any one of examples 22-34, wherein processing the return signals comprises setting, by operation of a local clock subsystem of the receiver station, a local reference time and a local reference phase for the receiver station.

Example 36. The radar method of example 35,
- wherein a plurality of receiver stations each process respective return signals based on probe signals scattered from the one or more objects in the region; and
- wherein the radar method comprises:

exchanging, by operation of a global clock station, synchronization signals with the transmitter station and the local clock subsystem of each receiver station, the synchronization signals representing a global reference time and a global reference phase.

Example 37. The radar method of example 21 or any one of examples 22-36,
wherein a plurality of receiver stations each process respective return signals based on probe signals scattered from the one or more objects in the region; and
wherein the radar method comprises:
receiving, at a data control station, multiple time series of property data from respective receiver stations;
generating, by operation of the data control center, processed data based on the multiple time series of property data, the processed data representing a characteristic of the target object in the region, and
communicating the processed data to the transmitter station, one or more of the plurality of receiver stations, or both.

Example 38. The radar system of example 21 or any one of examples 22-37,
wherein the transmitter station is a cooperative transmitter station; and
wherein transmitting the probe signals comprises:
receiving control signals at the transmitter station, and
transmitting the probe signals of RF electromagnetic radiation into the region in response to the received control signals.

Example 39. The radar system of example 21 or any one of examples 22-38,
wherein the transmitter station is a noncooperative transmitter station; and
wherein transmitting the probe signals comprises passively emitting the RF electromagnetic radiation into the region.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A radar system, comprising:
a transmitter station configured to emit probe signals of RF electromagnetic radiation into a region; and
a receiver station configured to process return signals of RF electromagnetic radiation from the region, the return signals based on probe signals scattered from one or more objects in the region, the receiver station comprising:
a photonic crystal receiver formed of dielectric material and comprising:
an antenna structure configured to couple to a target RF electromagnetic radiation, the return signals of RF electromagnetic radiation comprising the target RF electromagnetic radiation,
a photonic crystal structure having an elongated slot disposed therein and configured to concentrate the target RF electromagnetic radiation in the elongated slot, and
a vapor disposed in the elongated slot,
an optical system configured to generate spectroscopic data based on optical signals from the photonic crystal receiver, the spectroscopic data representing one or more properties of the target RF electromagnetic radiation, and
a data processing subsystem configured to generate a time series of property data based on the spectroscopic data, the time series of property data representing one or more properties of the target RF electromagnetic radiation over time.

2. The radar system of claim 1, wherein the time series of property data comprises at least one of:
amplitude data representing an amplitude of the target RF electromagnetic radiation over time;
phase data representing a phase of the target RF electromagnetic radiation over time; or
frequency data representing a frequency of the target RF electromagnetic radiation over time.

3. The radar system of claim 1,
wherein the antenna structure comprises a polarizer configured to filter a polarization of the target RF electromagnetic radiation; and
wherein the time series of property data comprises polarization data representing a polarization of the target RF electromagnetic radiation over time.

4. The radar system of claim 1, wherein the data processing subsystem is further configured to determine, based on the time series of property data, a characteristic of a target object in the region.

5. The radar system of claim 4, wherein the characteristic comprises at least one of:
a location of the target object in the region;
a velocity of the target object;
a shape of the target object; or
a composition of the target object.

6. The radar system of claim 1,
wherein the photonic crystal receiver is a first photonic crystal receiver and the receiver station comprises a second photonic crystal receiver;
wherein a first antenna structure of the first photonic crystal receiver is configured to couple to a first frequency of the target RF electromagnetic radiation; and
wherein a second antenna structure of the second photonic crystal receiver is configured to couple to a second, different frequency of the target RF electromagnetic radiation.

7. The radar system of claim 1,
wherein the photonic crystal receiver is a first photonic crystal receiver and the receiver station comprises a second photonic crystal receiver;

wherein a first antenna structure of the first photonic crystal receiver comprises a first polarizer configured to filter a first polarization of the target RF electromagnetic radiation; and wherein a second antenna structure of the second photonic crystal receiver comprises a second polarizer configured to filter a second, different polarization of the target RF electromagnetic radiation.

8. The radar system of claim 1, wherein the receiver station comprises an inertial navigation subsystem configured to determine a position of the receiver station.

9. The radar system of claim 1, wherein the receiver station comprises a local clock subsystem configured to set one or both of a local reference time and a local reference phase for the receiver station.

10. The radar system of claim 9, comprising:
a plurality of receiver stations comprising respective local clock subsystems; and
a global clock station configured to exchange synchronization signals with the transmitter station and the local clock subsystem of each receiver station, the synchronization signals representing a global reference time and a global reference phase for the radar system.

11. The radar system of claim 1, comprising:
a plurality of receiver stations comprising respective local clock subsystems; and
a data control center configured to communicate with the transmitter station and the plurality of receiver stations and to perform operations comprising:
generating processed data based on multiple time series of property data from respective receiver stations, the processed data representing a characteristic of the target object in the region, and
communicating the processed data to the transmitter station, one or more of the plurality of receiver stations, or both.

12. The radar system of claim 1, wherein the optical system comprises a laser subsystem configured to provide, to the elongated slot, input optical signals that interact with one or more electronic transitions of the vapor.

13. The radar system of claim 1, wherein the optical system comprises an optical detection subsystem configured to generate the spectroscopic data based on output optical signals from the elongate slot.

14. The radar system of claim 1, wherein the transmitter station is a cooperative transmitter station configured to emit probe signals of RF electromagnetic radiation into the region in response to control signals.

15. The radar system of claim 1, wherein the transmitter station is a noncooperative transmitter station configured to passively emit probe signals of RF electromagnetic radiation into the region.

16. A radar method for detecting a target object in a region, the radar method comprising:
by operation a transmitter station, transmitting probe signals of RF electromagnetic radiation into the region;
by operation a receiver station, processing return signals of RF electromagnetic radiation from the region, the return signals based on probe signals scattered from one or more objects in the region, wherein processing the return signals comprises:
at a photonic crystal receiver of the receiver station, receiving the return signals of RF electromagnetic radiation from the region, the photonic crystal receiver comprising:
an antenna structure configured to couple to a target RF electromagnetic radiation, the return signals of RF electromagnetic radiation comprising the target RF electromagnetic radiation,
a photonic crystal structure having an elongated slot disposed therein and configured to concentrate the target RF electromagnetic radiation in the elongated slot, and
a vapor disposed in the elongated slot;
by operation of an optical system of the receiver station, generating spectroscopic data based on optical signals from the photonic crystal receiver, the spectroscopic data representing one or more properties of the target RF electromagnetic radiation; and
by operation of a data processing subsystem of the receiver station, generating a time series of property data based on the spectroscopic data, the time series of property data representing one or more properties of the target RF electromagnetic radiation over time.

17. The radar method of claim 16, wherein processing the return signals comprises:
determining, by operation of the data processing subsystem, a characteristic of the target object in the region based on the time series of property data.

18. The radar method of claim 17, wherein the characteristic comprises at least one of:
a location of the target object in the region;
a velocity of the target object;
a shape of the target object; or
a composition of the target object.

19. The radar method of claim 16, wherein processing the return signals comprises:
passing, through the elongated slot, input optical signals that interact with one or more electronic transitions of the vapor; and
receiving, at the optical subsystem, output optical signals from the elongated slot based on the input optical signals, the spectroscopic data generated based on the output optical signals.

20. The radar method of claim 16,
wherein the antenna structure comprises a polarizer configured to filter a polarization of the target RF electromagnetic radiation; and
wherein receiving the return signals comprises filtering a polarization of the return signals of RF electromagnetic radiation using the polarizer of the antenna structure.

21. The radar method of claim 16,
wherein the photonic crystal receiver is a first photonic crystal receiver and the receiver station comprises a second photonic crystal receiver;
wherein a first antenna structure of the first photonic crystal receiver comprises a first polarizer configured to filter a first polarization of the target RF electromagnetic radiation;
wherein a second antenna structure of the second photonic crystal receiver comprises a second polarizer configured to filter a second, different polarization of the target RF electromagnetic radiation; and
wherein receiving the return signals comprises filtering a polarization of the return signals of RF electromagnetic radiation using the first and second polarizers of, respectively, the first and second antenna structures.

22. The radar method of claim 16, wherein processing the return signals comprises determining, by operation of an inertial navigation subsystem of the receiver station, a position of the receiver station.

23. The radar method of claim 16, wherein processing the return signals comprises setting, by operation of a local clock subsystem of the receiver station, a local reference time and a local reference phase for the receiver station.

24. The radar method of claim 23,
wherein a plurality of receiver stations each process respective return signals based on probe signals scattered from the one or more objects in the region; and
wherein the radar method comprises:
exchanging, by operation of a global clock station, synchronization signals with the transmitter station and the local clock subsystem of each receiver station, the synchronization signals representing a global reference time and a global reference phase.

25. The radar method of claim 16,
wherein a plurality of receiver stations each process respective return signals based on probe signals scattered from the one or more objects in the region; and
wherein the radar method comprises:
receiving, at a data control station, multiple time series of property data from respective receiver stations;
generating, by operation of the data control center, processed data based on the multiple time series of property data, the processed data representing a characteristic of the target object in the region, and
communicating the processed data to the transmitter station, one or more of the plurality of receiver stations, or both.

26. The radar system of claim 16,
wherein the transmitter station is a cooperative transmitter station; and
wherein transmitting the probe signals comprises:
receiving control signals at the transmitter station, and
transmitting the probe signals of RF electromagnetic radiation into the region in response to the received control signals.

27. The radar system of claim 16,
wherein the transmitter station is a noncooperative transmitter station; and
wherein transmitting the probe signals comprises passively emitting the RF electromagnetic radiation into the region.

* * * * *

UNITED STATES PATENT AND TRADEMARK OFFICE
CERTIFICATE OF CORRECTION

Page 1 of 1

PATENT NO. : 11,137,487 B1
APPLICATION NO. : 17/201830
DATED : October 5, 2021
INVENTOR(S) : Amarloo et al.

It is certified that error appears in the above-identified patent and that said Letters Patent is hereby corrected as shown below:

On the Title Page

Column 1, Line 1, After "2021", insert -- ¶(65) Prior Publication Data
US 2021/0286063 A1 Sep. 16, 2021 --

In the Specification

Column 9, Line 30, Delete "201." and insert -- 204. -- therefor

Column 11, Line 6, Delete "200" and insert -- 202 -- therefor

Column 18, Line 54, Delete "450)" and insert -- 420) -- therefor

Column 19, Line 66, Delete "450" and insert -- 456 -- therefor

Column 23, Line 13, Delete "452" and insert -- 450 -- therefor

Column 30, Line 34, Delete "200 MHz" and insert -- ~200 MHz -- therefor

Column 30, Line 35, Delete "Nz." and insert -- $N_2$. -- therefor

Column 37, Line 21, Delete "system" and insert -- method -- therefor

Column 37, Line 30, Delete "system" and insert -- method -- therefor

In the Claims

Column 42, Claim 26, Line 6, Delete "system" and insert -- method -- therefor

Column 42, Claim 27, Line 14, Delete "system" and insert -- method -- therefor

Signed and Sealed this
Twenty-first Day of December, 2021

Drew Hirshfeld
*Performing the Functions and Duties of the
Under Secretary of Commerce for Intellectual Property and
Director of the United States Patent and Trademark Office*